(12) United States Patent
Okumura et al.

(10) Patent No.: US 7,999,293 B2
(45) Date of Patent: Aug. 16, 2011

(54) PHOTODIODE SEMICONDUCTOR DEVICE AND MANUFACTURING METHOD

(75) Inventors: Yohichi Okumura, Tokyo (JP); Hiroyuki Tomomatsu, Oita (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/825,540

(22) Filed: Jun. 29, 2010

(65) Prior Publication Data

US 2010/0258895 A1    Oct. 14, 2010

Related U.S. Application Data

(63) Continuation of application No. 11/393,935, filed on Mar. 29, 2006, now Pat. No. 7,745,857.

(30) Foreign Application Priority Data

Mar. 29, 2005 (JP) ................. 2005-094009

(51) Int. Cl.
    *H01L 296/06* (2006.01)
(52) U.S. Cl. ........ 257/292; 257/233; 257/231; 257/448; 257/435; 257/293
(58) Field of Classification Search .................. 257/231, 257/293, 294, 292, 448, 435, 461, 440, E27.133
    See application file for complete search history.

(56) References Cited

U.S. PATENT DOCUMENTS

| 5,844,290 A | 12/1998 | Furumiya |
| 2005/0051860 A1 | 3/2005 | Takeuchi et al. |
| 2005/0101073 A1 | 5/2005 | Bae et al. |
| 2006/0138580 A1 * | 6/2006 | Kim et al. ............ 257/461 |

\* cited by examiner

*Primary Examiner* — Cuong Q Nguyen
*Assistant Examiner* — Trang Q Tran
(74) *Attorney, Agent, or Firm* — Warren L. Franz; Wade J. Brady III; Frederick J. Telecky, Jr

(57) ABSTRACT

The invention provides a semiconductor device manufactured with a plurality of photodiodes so that it does not short circuit, and includes an opening without leakage. A second semiconductor layer (12, 16) of second conductivity type is formed on a main surface of a first semiconductor layer (10, 11) of the first conductivity type. Element-separating regions (13, 14, 15, 17) are formed at least on the second semiconductor layer to separate the device into the regions of photodiodes (PD1-PD4). A conductive layer (18) is formed on the second semiconductor layer 16 in a divided pattern that provides a segment for each photodiode and is connected to the second semiconductor layer (16) along the an outer periphery with respect to all photodiodes. An insulation layer (19, 21) is formed on the entire surface to cover conductive layer (18). An opening, which reaches the second semiconductor layer (16), is formed in the insulation layer (19, 21) in the region inside the pattern of conductive layer (18).

20 Claims, 33 Drawing Sheets

PHOTODIODE SEMICONDUCTOR DEVICE AND MANUFACTURING METHOD

This is a continuation of application Ser. No. 11/393,935 filed Mar. 29, 2006, the entirety of which is incorporated herein by reference, and which claims priority of Japanese Patent Application No. JP 2005-094009 filed Mar. 29, 2005, a certified copy of which was filed therein.

BACKGROUND

This relates to an integrated circuit semiconductor device having a plurality of adjacent photodiodes and to a method of manufacturing the same.

Photodiodes generate current upon receiving light. They are widely used as light-receiving elements for optical pick-up devices incorporated into optical disc devices, such as CD or DVD devices. A photodiode is constituted by a pn junction formed in a semiconductor material. A reverse bias is applied to the pn junction to widen the depletion layer, and a high electric field is applied. Electron-hole pairs are generated in the depletion layer by the absorbed light. Under the attraction of the electric field, electrons move to the n-type semiconductor region, while holes move to the p-type semiconductor region, thereby causing a current to flow.

Types of photodiodes include PIN photodiodes and avalanche photodiodes. PIN photodiodes include a p– or n– layer or other intrinsic layer (referred to as Layer I) having a conductivity impurity at low concentration between p and n layers and can easily widen the depletion layer at a low voltage. Avalanche photodiodes include a region where avalanche decay occurs.

Japanese Kokai Patent Application No. 2001-320079 discloses a method of manufacturing a photodiode that can be used to remove an insulation film on the top layer of the diode without having film peel-off or leakage. An example photodiode formed by this method is shown in FIGS. 26A and 26B.

As shown in FIGS. 26A and 26B, a p–-type epitaxial layer 101 is formed as Layer I on a p++-type silicon semiconductor substrate 100, and an n-type epitaxial layer 102 is formed on the layer 101 to form a pn junction. An n+-type semiconductor region 103 is formed in a surface portion of n-type epitaxial layer 102 in the PIN photodiode region. A silicon nitride layer 103a is formed on the surface in the central part of n+-type semiconductor region 103. Silicide layer 103b, made of platinum silicide, etc., is formed near the edge of n+-type semiconductor region 103 in the outer periphery of silicon nitride layer 103a. Silicon nitride layer 103a and silicide layer 103b have a film thickness of, for example, 30 nm. An insulating film 104 is formed using a LOCOS process to surround the PIN photodiode region.

A ring-shaped mask layer 105 made of metal is formed from n+-type semiconductor region 103 in the outer periphery of the PIN photodiode to element-separating insulation film 104, and an interlayer insulating film 106 is formed on the mask layer 105. An opening H is formed in interlayer insulation film 106 along the inner periphery of metal layer 105 to expose the surface of silicon nitride layer 103a and silicide layer 103b on n+-type semiconductor region 103 in the photodiode region. A surface protective layer 108 is formed to cover the opening H.

For the PIN photodiode PD formed with the described configuration, when a reverse bias is applied to n+-type semiconductor region 103 and p–-type epitaxial layer 101, the depletion layer is widened from the pn junction surface. When light is incident on the formed depletion layer, electron hole pairs are generated, and signals are generated. In this case, mask layer 105 is connected to n+ semiconductor region 103, and voltage can be applied to n+-type semiconductor region 103 via mask layer 105.

As shown in FIGS. 27A and 27B, a method of forming the described PIN photodiode PD includes forming p-type epitaxial layer 101 and n-type epitaxial layer 102 on p++-type silicon semiconductor substrate 100, and performing element isolation using LOCOS (local oxidation of silicon) element-separating insulation film 104. The n+-type semiconductor region 103 is formed by implanting ions into a surface part of n-type epitaxial layer 102 in the PIN photodiode region separated by LOCOS element-separating insulation film 104, etc. A silicon nitride layer 103a with a thickness of about 30 nm is formed on the surface in the central part of n+-type semiconductor region 103. With silicon nitride layer 103a used as a siliciding mask, a silicide layer 103b, made of platinum silicide, etc., and having a thickness of about 30 nm is formed on the surface near the edge of n+-type semiconductor region 103 in the outer periphery of silicon nitride layer 103a. Then, a metal layer, made of TiW, etc., is deposited in a thickness of 200-300 nm by means of sputtering, followed by patterning to form mask layer 105 that covers n+-type semiconductor region 103 and is extended all the way to LOCOS element-separating insulation film 104. Then, insulation film 106 is formed on the entire surface of mask layer 105. In this case, insulation film 106 is formed by laminating a plurality of layers by depositing silicon oxide by CVD (chemical vapor deposition) with TEOS (tetraethyl orthosilicate) used as the raw material, or by depositing a BPSG (borophosphosilicate glass) film, or by depositing silicon nitride via CVD.

Then, as shown in FIGS. 28A and 28B, a resist film 107 with a pattern that opens the photosensitive region of the photodiode is formed on insulation film 106. After that, dry etching, such as RIE (reactive ion etching), is performed to remove the insulation film 106 from the photosensitive region and form opening H with the mask layer 105 serving as an etch stop layer. Then, as shown in FIGS. 29A and B, the portion of mask layer 105 exposed in the opening H is removed selectively with respect to n+-type semiconductor region 103 (silicon substrate) and insulation film 106 by means of wet etching to expose the n+-type semiconductor region 103. Then, a surface protective layer 108 is formed on the entire surface to obtain the semiconductor device having the PIN photodiode PD as shown in FIGS. 26A and 26B.

In the method of manufacturing a semiconductor device having such a PIN photodiode, when removing the insulation film 106 from the diode, since mask layer 105 serves as an etch stop, even if dry etching is used so that no hollow parts are formed on the inner wall surface of opening H to cause film peeling, no damage will be caused that will allow leakage because the silicon substrate is protected by mask layer 105 in that step. Also, when removing the portion of mask layer 105 exposed in the opening H, even if wet etching is used to avoid damage to the silicon substrate, mask layer 105 can be removed selectively without forming hollow parts on the inner wall surface of opening H of insulation film 106.

However, when such a photodiode is used as a light-receiving element for an optical pick-up device incorporated into a CD, DVD, or other optical disc device, in order to obtain the tracking error signal or focus error signal from the signal fed back from the optical disc, it is necessary to use a photodiode integrated circuit (PDIC) formed by combining a plurality of photodiodes.

FIG. 30 is a plan view of a PDIC formed by combining, for example, four PIN photodiodes. This figure shows how a laser spot S, which is the signal fed back from the optical disc, is incident on the four PIN photodiodes PD1-4. In this case, laser spot S is incident to target the center of the four PIN photodiodes PD1-4. However, since the part in the intervals between the four PIN photodiodes PD1-4 becomes a dead area, it is desirable to reduce the intervals between the four PIN photodiodes PD1-4 to, for example, 5 μm or less in order to increase the sensitivity.

FIG. 31 is a plan view illustrating the light-receiving surfaces of the photodiodes when the method described in Japanese Kokai Patent Application No. 2001-320079 is applied to the four PIN photodiodes PD1-4 with the intervals reduced to about 5 μm as mentioned. The four PIN photodiodes PD1-4 are covered by a common mask layer 110. After the opening is formed in the insulation film, the mask layer exposed in the opening is removed. In this case, however, mask layer 110, which is a common conductive layer, is connected to the n+-type semiconductor region equivalent to the light-receiving surface of each of the four PIN photodiodes PD1-4. As a result, a short circuit between the diodes becomes a problem.

FIG. 32 is a plan view illustrating the light-receiving surface of a photodiode in the case when the mask layers are formed independently, and the four PIN photodiodes PD1-4 with an opening formed in each of them are laid out as close to each other as possible. Here, independent mask layers (111-114) are formed with respect to the four PIN photodiodes PD1-4, respectively. In this layout, however, the intervals between the four PIN photodiodes PD1-4 are increased to 20 μm, making it difficult to use them as the light-receiving element of an optical pick-up device.

SUMMARY

The invention provides a semiconductor device and a method for manufacturing a semiconductor device that address the above-described problems.

In one aspect of the invention, a semiconductor device is provided having a plurality of photodiodes formed side-by-side using element-separating regions. A described embodiment has a first semiconductor layer of a first conductivity type, a second semiconductor layer of a second conductivity type formed on a main surface of the first semiconductor layer, element-separating regions formed at least in the second semiconductor layer to separate the plurality of photodiodes from each other, a conductive layer that is connected to the second semiconductor layer in the outer periphery with respect to all of the plurality of photodiodes and is formed on the second semiconductor layer in a pattern divided for each of the photodiodes, and an insulating layer formed on the entire surface to cover the conductive layer. An opening is formed in the insulating layer down to the second semiconductor layer in the region inside the pattern of the conductive layer.

In a described device, even though the opening is formed in the insulation film in order to improve the sensitivity, since the conductive layer and the mask layer are used as an etch stop, leakage-causing damage can be prevented. And, since the conductive layer connected to the second semiconductor layer that constitutes each photodiode is formed in a pattern divided for each photodiode, the photodiodes can be constituted so as to avoid short circuiting.

For a described semiconductor device, the insulating layer preferably includes a first insulating layer and a second insulating layer formed on the first insulating layer, with a mask layer formed between the first and second insulating layers or on the first insulating layer. More preferably, the mask layer is formed in a pattern having regions superposed with the conductive layer formed on the second semiconductor layer of the adjacent photodiodes. And, most preferably, the mask layer is formed in a pattern having the superposed regions outside the conductive layer. Or, the conductive layer is also formed on the element-separating regions between the photodiodes, and the mask layer is formed in a pattern having the superposed regions on the conductive layer on the element-separating regions between the photodiodes in the opening inside the conductive layer. Also, preferably, the mask layer is formed in a ring shape along the outer periphery of the opening.

In another aspect, the invention provides a method for manufacturing a semiconductor device having a plurality of photodiodes formed side-by-side via element-separating regions.

A described manufacturing method includes forming a second semiconductor layer of a second conductivity type on a main surface of a first semiconductor layer of a first conductivity type. Element-separating regions are formed at least in the second semiconductor layer to separate the plurality of photodiodes from each other. A conductive layer is formed on the second semiconductor layer, and a first insulating layer is formed on the conductive layer. A mask layer having regions superposed with the conductive layer is formed on the first insulating layer, and a second insulating layer is formed on the mask layer. A first etching step is conducted to form an opening in the first and second insulating layers, exposing the conductive layer and mask layer within the opening. The conductive layer and mask layer are used as an etch stop in a pattern so that the conductive layer and/or mask layer is present at any position in the opening region. A second etching step is conducted in which the conductive layer exposed in the opening is removed.

For a described method, the conductive layer is preferably formed in a pattern covering all of the photodiodes. The mask layer is formed in a pattern having regions superposed with the conductive layer in the outside region of the conductive layer in the extended parts of the element-separating regions between the adjacent photodiodes. In the second etching step, the conductive layer in the superposed regions is removed by means of overetching. Or, preferably, the conductive layer may be formed to extend to cover the element-separating regions between the adjacent photodiodes. The mask layer is formed in a pattern having regions superposed with the conductive layer on the element-separating regions between the photodiodes. Also, preferably, the first etching is dry etching, while the second etching is wet etching.

In a described method, a conductive layer is formed on the second semiconductor layer to be connected to the second semiconductor layer in the outer periphery with respect to all of the plurality of photodiodes and in a pattern divided for each of the photodiodes. A first mask layer is formed in the region inside the conductive layer on the second semiconductor layer. A first insulating layer is formed on the conductive layer and the first mask layer. A first etching step is conducted to form an opening in the first insulating layer using the first mask layer as an etch stop. A second etching step is performed in which the first mask layer exposed in the opening is completely removed by means of overetching, including the part remaining on the outer periphery of the opening.

Preferably, the described manufacturing method also has a step in which a ring-shaped second mask layer having a superposed region in the outer periphery of the first mask layer is formed on the first insulating layer, after the first insulating layer is formed but before the first etching step; and a step in which a second insulating layer is formed on the second mask layer. In the first etching step, an opening exposing the conductive layer and mask layer is formed in the first and second insulating layers with the conductive layer and mask layer used as an etch stop in such a pattern that the conductive layer and/or mask layer are present at any position in the opening region. Also, preferably, the first etching is dry etching, while the second etching is wet etching.

DETAILED DESCRIPTION OF EXAMPLE EMBODIMENTS

First Embodiment

A first example embodiment of a semiconductor device and its manufacture are described with reference to FIGS. 1A-7C.

Figure 1A:
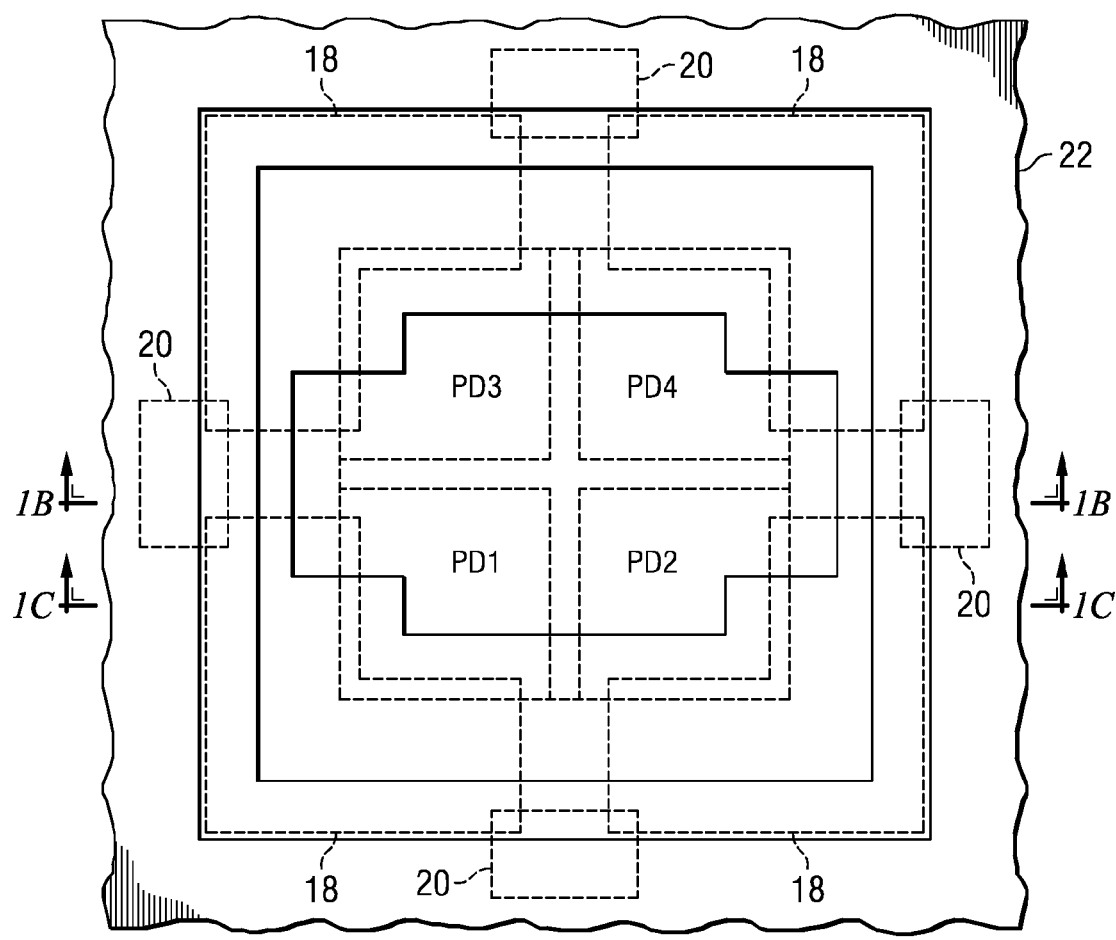
FIG. 1A is a plan view and FIGS. 1B and 1C are section views, taken along respective section lines 1B-1B and 1C-1C in FIG. 1A, of a semiconductor device according to a first embodiment of the invention.
Figure 1B:
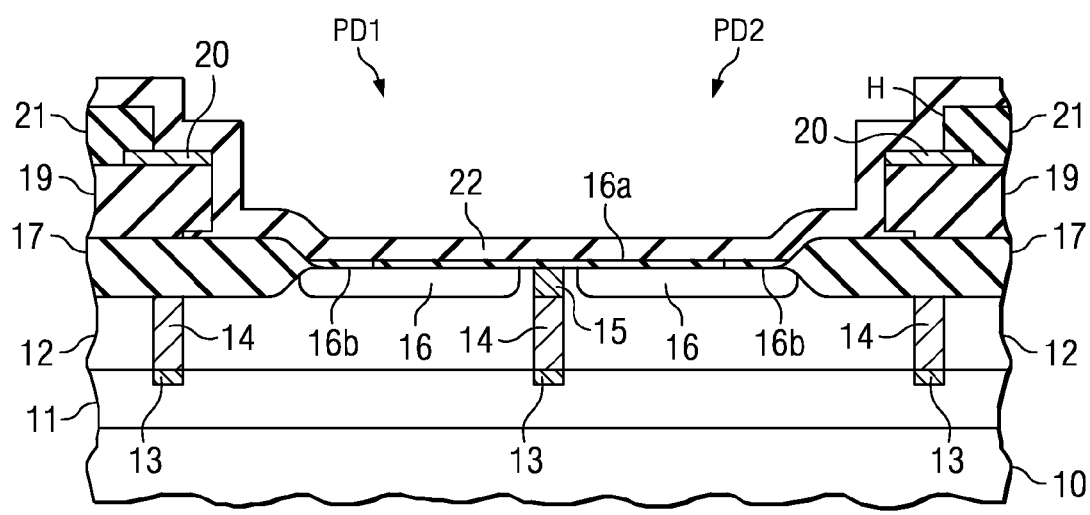

As shown in FIGS. 1A and 1B, the semiconductor device in this embodiment has four photodiode regions PD1-PD4 formed adjacent to each other, in side-by-side relationships between isolation regions 17. In the illustrated example, a p−-type epitaxial layer 11 is formed as Layer I on a p++-type silicon semiconductor substrate 10 and an n-type epitaxial layer 12 is formed on the epitaxial layer 11, to present a pn junction in a PIN structural arrangement for the photodiode device. A plurality of p++-type semiconductor regions 13, 14, 15 are formed to extend from a top of the epitaxial layer 12 to a surface layer part of the epitaxial layer 11 to divide the device into the four PIN photodiode regions PD1-PD4. An n+-type semiconductor region 16 is formed in the surface layer part of the epitaxial layer 12 in each of the PIN photodiode regions PD1-PD4. A silicon nitride layer 16a is formed on the surface in the central part of the semiconductor region 16; and a silicide layer 16b, made of platinum silicide, etc., is formed on the surface near the edge of the semiconductor region 16 in the outer periphery of the silicon nitride layer 16a. The silicon nitride layer 16a and silicide layer 16b may have a film thickness of, for example, 30 nm.

LOCOS (local oxidation of silicon) element-separating insulation film 17 is formed to surround and isolate the four PIN photodiode regions. Also, p++-type semiconductor regions 13, 14 are formed below the LOCOS element-separating insulation film to separate the elements.

As described above, the second semiconductor layer of the second conductivity type (n type epitaxial layer 12 and n+-type semiconductor region 16) is formed on the main surface of the first semiconductor layer of the first conductivity type (p++-type silicon semiconductor substrate 10 and p-type epitaxial layer 11) and is separated by the element-separating regions comprised of p++-type semiconductor regions 13, 14, 15 and LOCOS element-separating insulation film 17. In this way, four approximately square-shaped PIN photodiodes PD1-PD4 are formed adjacent to each other. The outer periphery of the entire device has an approximately square shape.

The length of a side of each square-shaped PIN photodiode region PD1-PD4 side is, for example, approximately several microns to tens of microns long. Each side of the approximately square-shaped device comprised of the four integrated photodiodes is, for example, about 40 μm long. Also, the intervals between adjacent ones of the PIN photodiodes PD1-PD4 are reduced to about 5 μm or less.

Conductive layer 18 (see FIGS. 1A and 1C), made of Al/TiW or other metal, is formed via silicide layer 16b on n+-type semiconductor region 16 in a pattern, which is connected to n+-type semiconductor region 16 that forms the second semiconductor layer along the outer periphery with respect to all four PIN photodiodes PD1-PD4, and is divided into marginal L-shaped border regions for each of PIN photodiodes PD1-PD4. In other words, each PIN photodiode PD1-PD4 has an approximately square shape, and conductive layer 18 is formed in a divided pattern connected to n+-type semiconductor region 16 via silicide layer 16b, with two adjacent inside sides of each L-shaped segment overlapping a corresponding two adjacent outside sides respectively of each photodiode region square.

A first insulation layer 19, made of silicon oxide, etc., is formed on the entire surface to cover conductive layer 18. A mask layer 20 (see FIGS. 1A and 1B), made of TiN/Al/TiN, for example, is formed on first insulation layer 19 in a pattern of rectangular segments (see FIG. 1A) having inside corner portions superposed with respective outside corner portions of L-shaped segments of conductive layer 18 of two adjacent PIN photodiodes, and having other portions between and outside, and not superposed with, the adjacent L-shaped segments.

A second insulation layer 21, made of silicon oxide, etc., is formed on the entire surface to cover mask layer 20. A hole or opening H that reaches down to silicon nitride layer 16a and silicide layer 16b on n+-type semiconductor region 16 that forms the second semiconductor layer is formed in the first insulation layer 19 and the second insulation layer 21 in the region within the patterns of conductive layer 18 and mask layer 20. A surface protective layer is formed to cover opening H.

When a reverse bias is applied to n+-type semiconductor region 16 and p--type epitaxial layer 11 in the four PIN photodiodes PD1-PD4 with the configuration shown, the depletion layer is widened from the pn junction boundary. When light is incident on the formed depletion layer, electron-hole pairs are generated to obtain optical signals. In the illustrated case, since conductive layer 18 is connected to n+-type semiconductor region 16 via silicide layer 16b, a voltage can be applied to n+-type semiconductor region 16 via conductive layer 18. Although the first and second insulation films 19, 20 attenuate the light incident on each PIN photodiode PD1-PD4, attenuation can be avoided by forming the opening H.

Figure 1C:
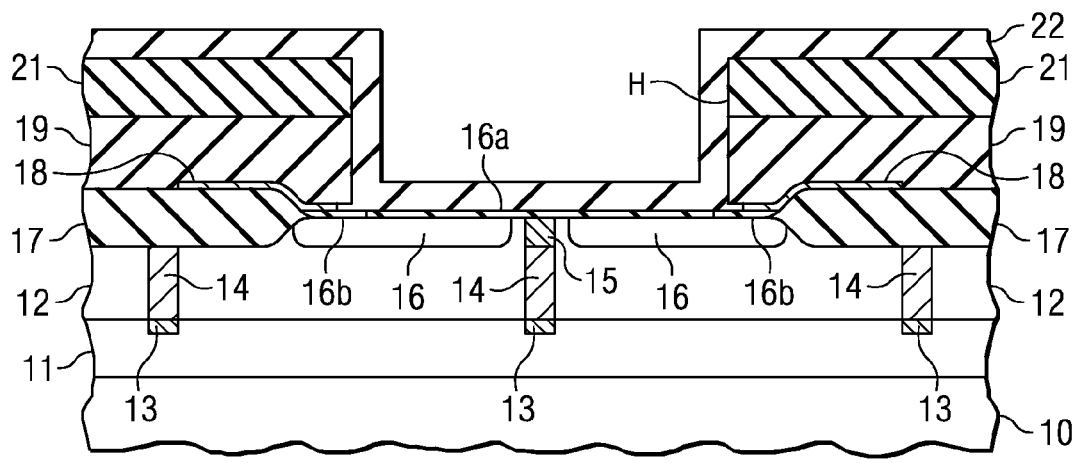

A method of manufacturing the semiconductor device shown in FIGS. 1A-1C is described with reference to FIGS. 2A-7C.

Figure 2A:
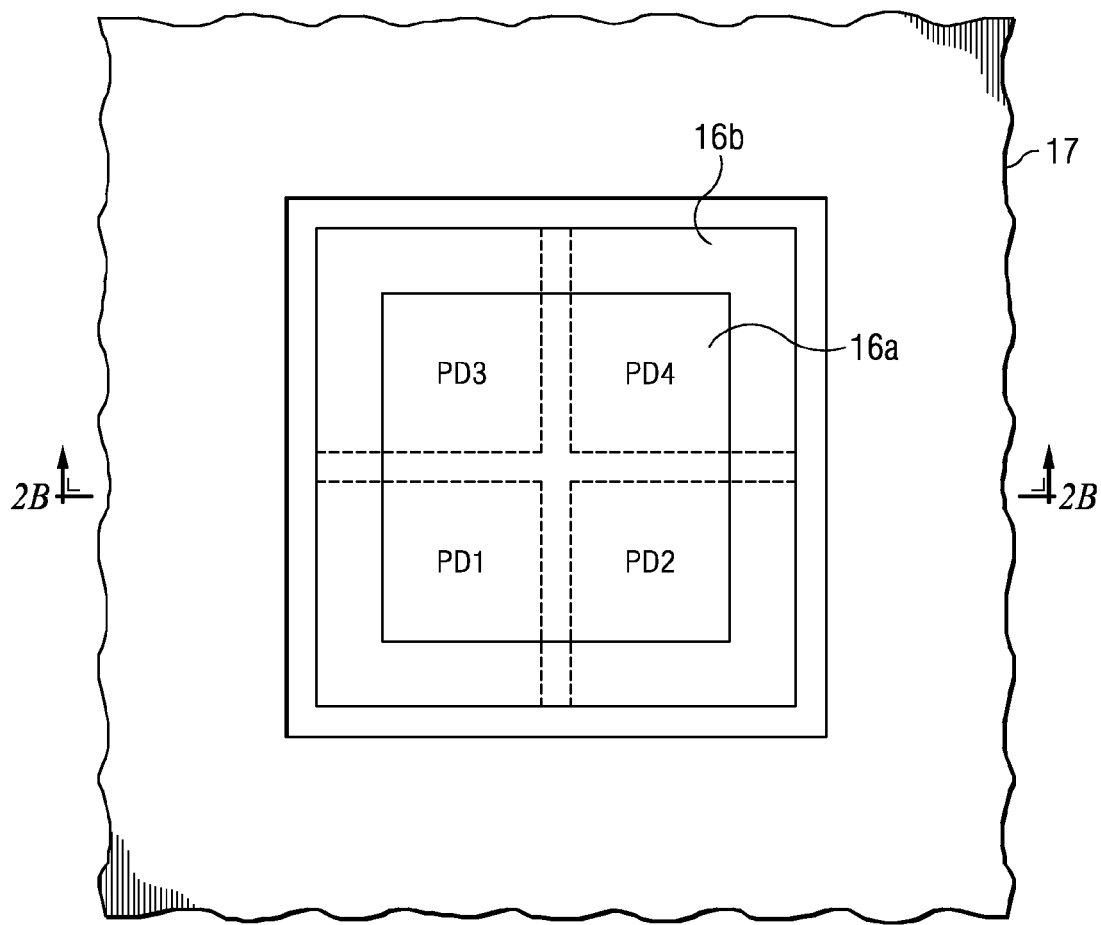
FIGS. 2A, 3A, 4A, 5A, 6A and 7A are plan views
Figure 2B:
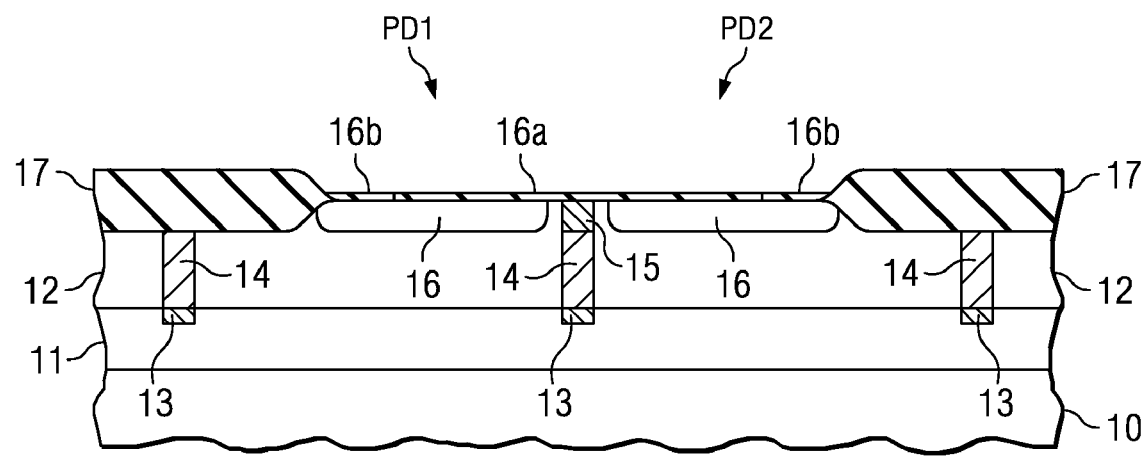
FIGS. 2B, 3B, 3C, 4B, 4C, 5B, 5C, 6B, 6C, 7B and 7C are section views, respectively taken along section lines identified by their figure numbers in the corresponding plan views, illustrating various steps in a process for the manufacture of the semiconductor device of FIGS. 1A-1C.

As shown in FIGS. 2A and 2B, for example, p-type epitaxial layer 11 and n-type epitaxial layer 12 are formed as Layer I by means of an epitaxial growth process on p++-type silicon semiconductor substrate 10. A p-type impurity is introduced before and after the epitaxial growth to form p++-type semiconductor regions 13, 14. Then, LOCOS element-separating insulation film regions 17 are formed to isolate the elements. A p++-type semiconductor region 15 is formed in the surface layer part of n-type epitaxial layer 12 to connect with p++-type semiconductor regions 13, 14 by introducing a p-type impurity, and n+-type semiconductor regions 16 are formed by introducing an n-type impurity. Silicon nitride layer 16a is formed in a thickness of about 30 nm on the surface in the central part of the n+-type semiconductor region 16. With silicon nitride layer 16a used as a mask in a silicide-preventing function, silicide layer 16b, made of platinum silicide, etc., is formed in a thickness of about 30 nm on the surface near the edge of n+-type semiconductor region 16, along the outer periphery of silicon nitride layer 16a. In this way, four PIN photodiodes PD1-PD4 having approximately square shapes are formed adjacent to each other. The PIN photodiodes PD1-PD4 are separated from each other by the p++-type semiconductor regions 13, 14, 15 formed in a cross shape.

Figure 3A:
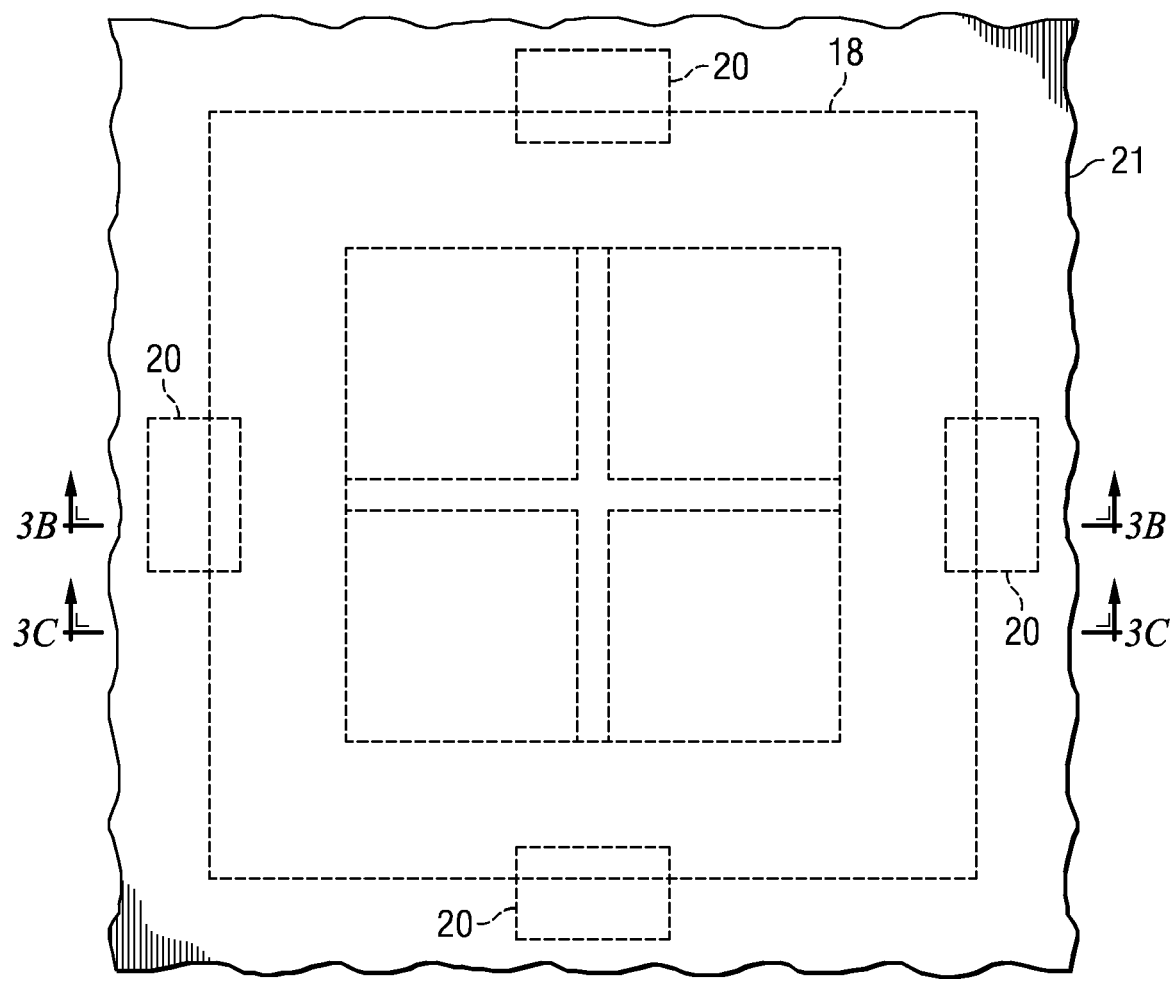
Figure 3B:
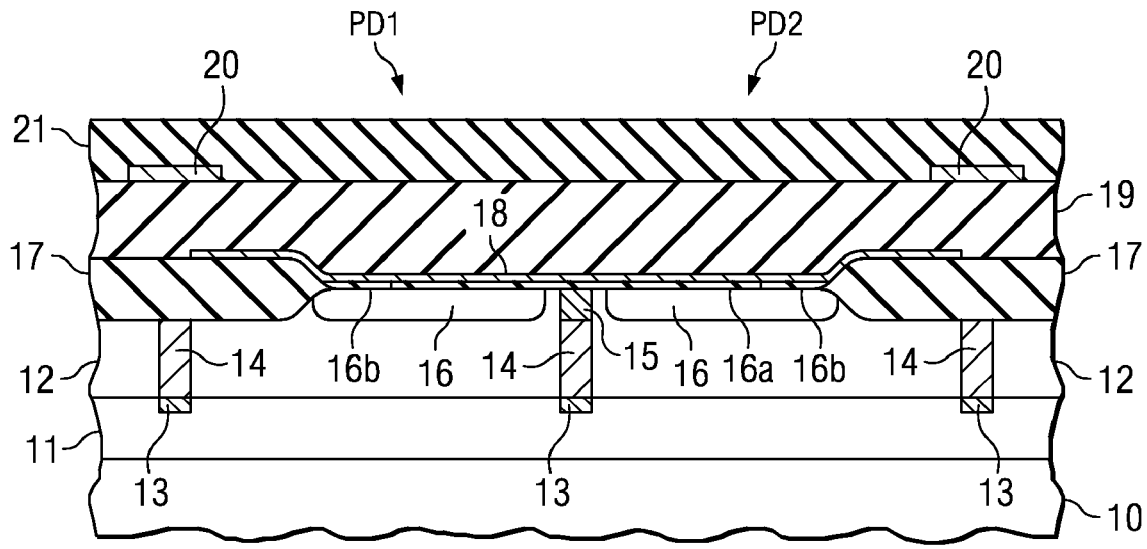
Figure 3C:
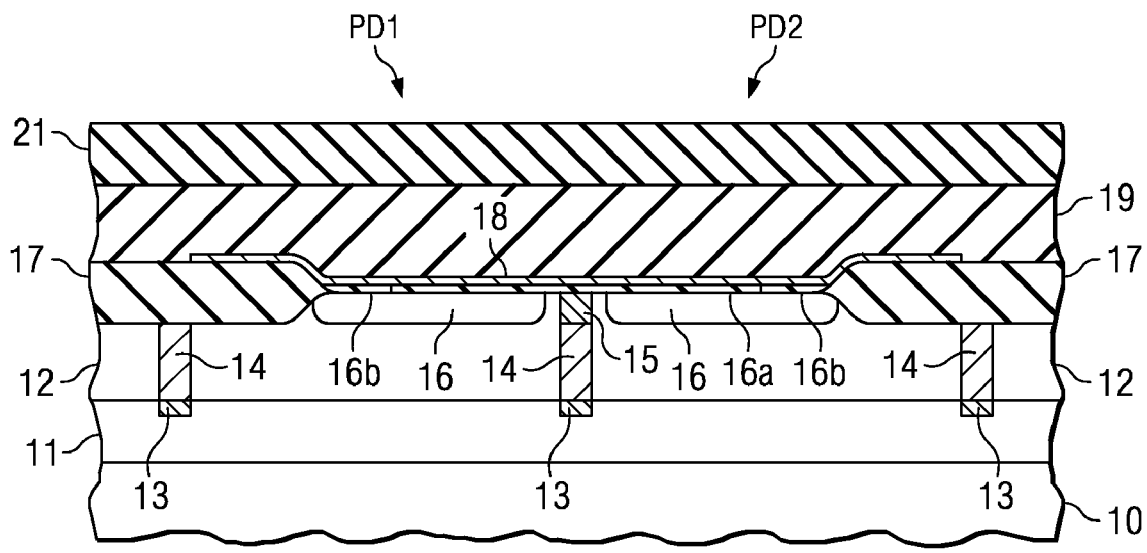

Then, as shown in FIGS. 3A-3C, a metal layer, made of Al/TiW, etc., is deposited in a thickness of 200-300 nm to cover silicon nitride layer 16a and silicide layer 16b on n+-type semiconductor region 16, followed by patterning to cover all four PIN photodiodes PD1-PD4 to form the illustrated conductive layer 18. The material of conductive layer 18 is not limited to Al/TiW, but may be any material that is removable with selectivity as to silicon nitride layer 16a and silicide layer 16b, as well as to later formed first insulation film 19 and second insulation film 20.

Then, first insulation film 19 is formed on the entire surface to cover conductive layer 18. First insulation film 19 is formed as a single layer or as plural laminated layers by depositing silicon oxide using CVD (chemical vapor deposition) with TEOS (tetraethyl orthosilicate) used as raw material, or by depositing a BPSG (silicon oxide film containing phosphorous and boron) film, or by depositing silicon nitride using CVD.

Then, TiN/Al/TiN, etc., is deposited to a thickness of 200-300 nm on first insulation film 19 by sputtering, for example, followed by patterning to form mask layer 20 having regions superposed with conductive layer 18 and regions outside of conductive layer 18 in the extended part of the element-separating region, between two adjacent PIN photodiodes. Like the first insulation film 19, the second insulation film 21 is formed on the entire surface to cover mask layer 20.

Figure 4A:
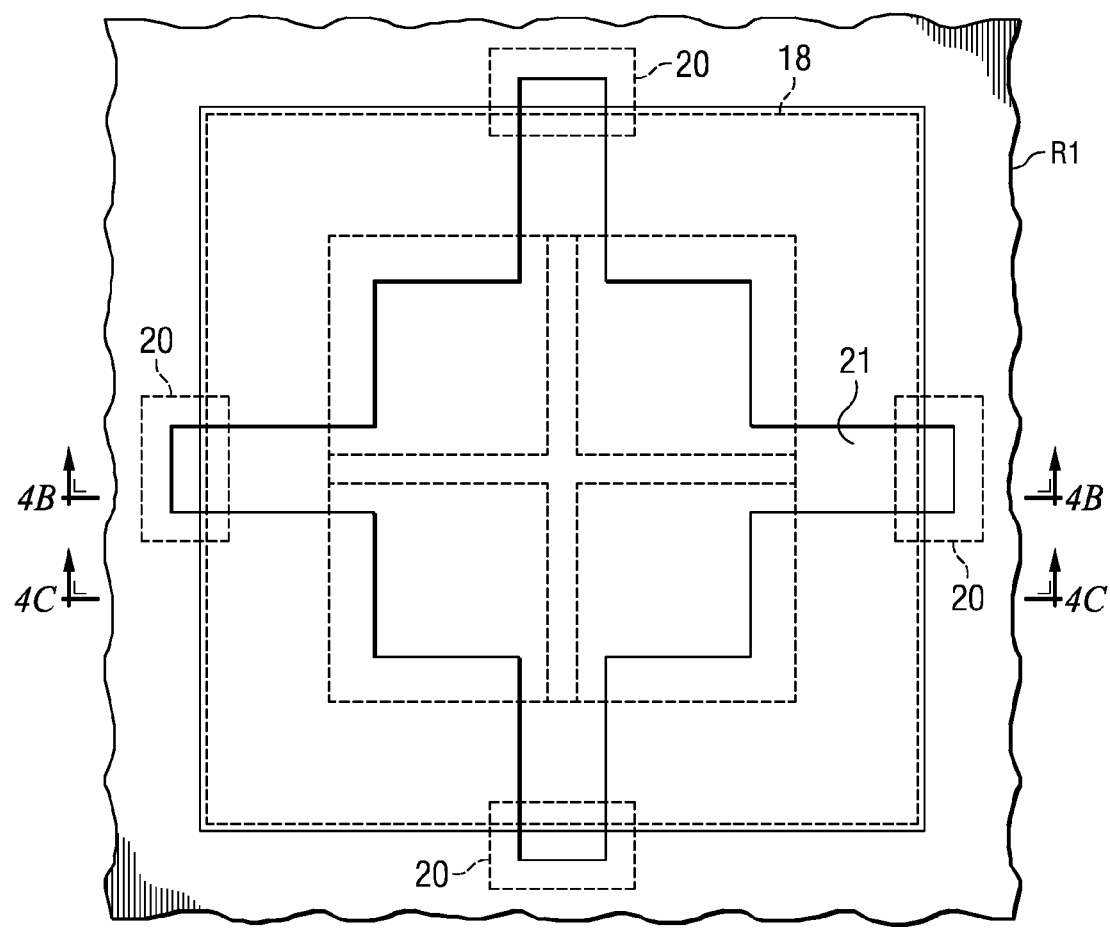
Figure 4B:
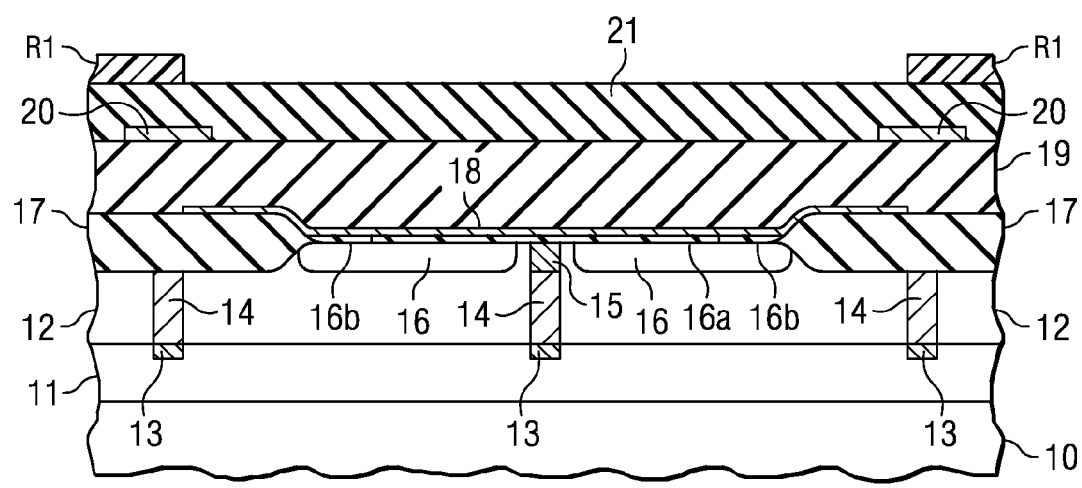
Figure 4C:
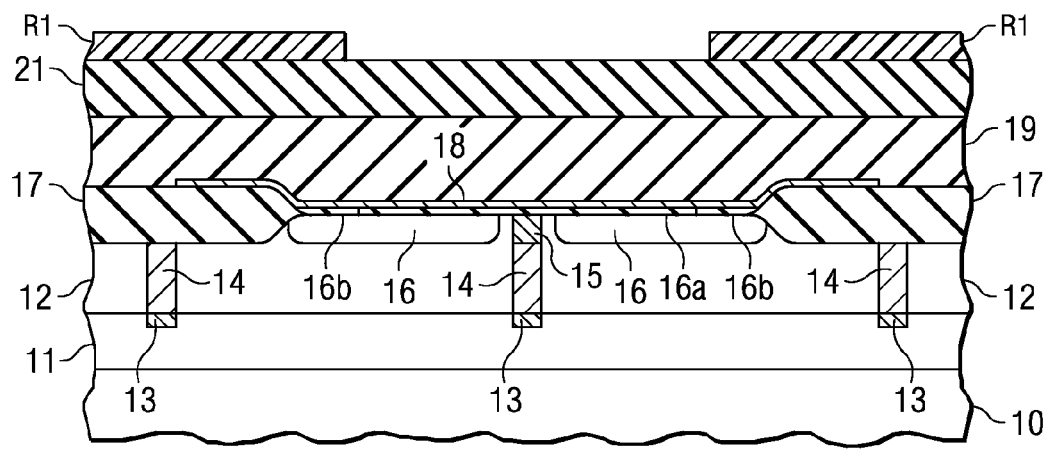
Figure 5A:
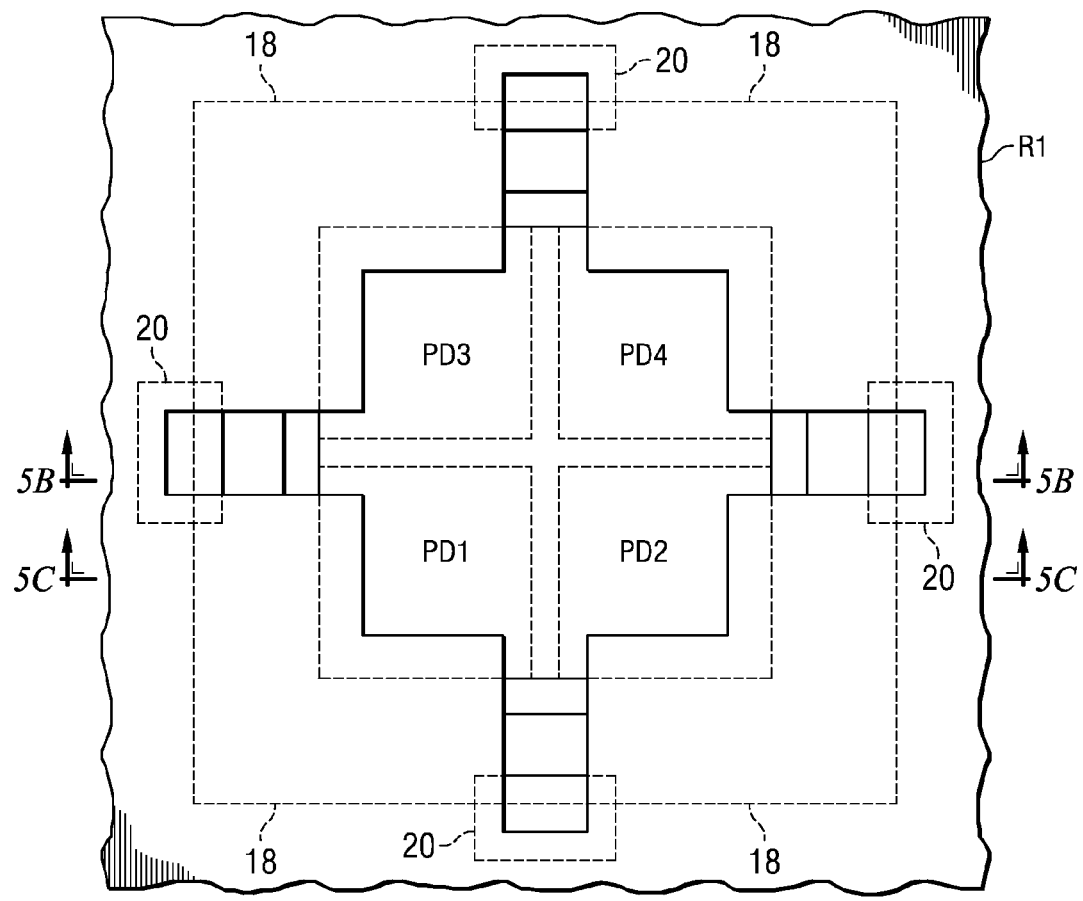
Figure 5B:
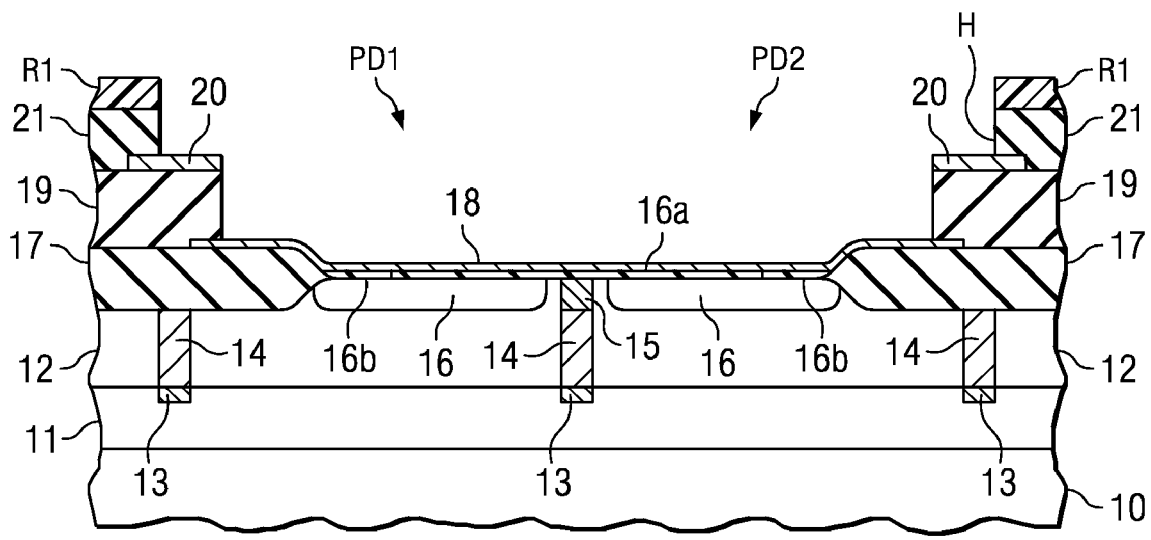
Figure 5C:
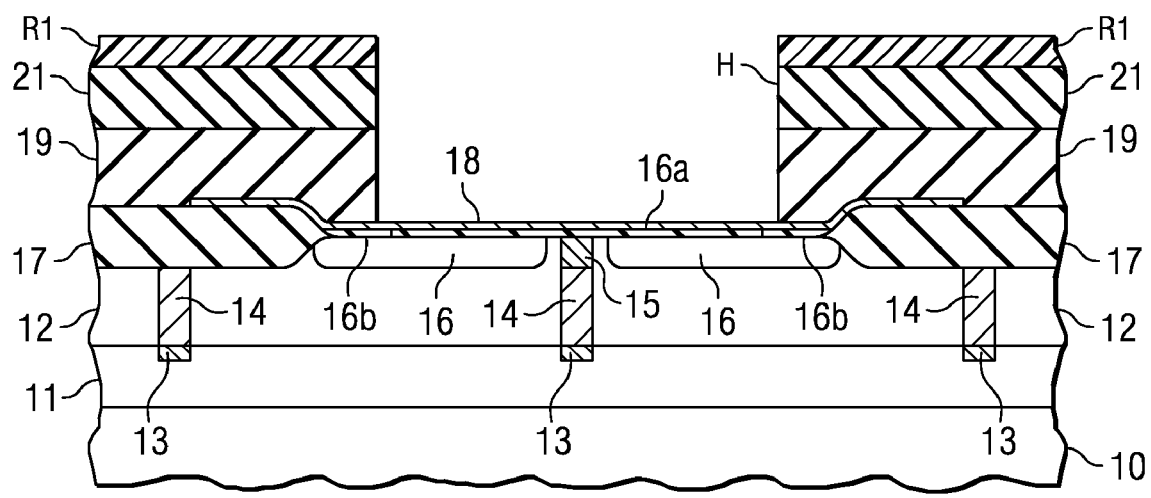

As shown in FIGS. 4A-4C, a resist film R1 is then formed and patterned with an opening region, so that conductive layer 18 and/or mask layer 20 is present at any position in the opening region. Then, as shown in FIGS. 5A-5C, dry etching (such as reactive ion etching) is performed as a first etching with conductive layer 18 and mask layer 20 used as an etch stop to form opening H in first insulation layer 19 and second insulation layer 21, which exposes conductive layer 18 and mask layer 20. In the illustrated case, the opening region of resist film R1 extends beyond the region where conductive layer 18 is formed. Mask layer 20 acts as an etch stop to prevent the etch that forms opening H from tunneling into element-separating insulation film 17.

Figure 6A:
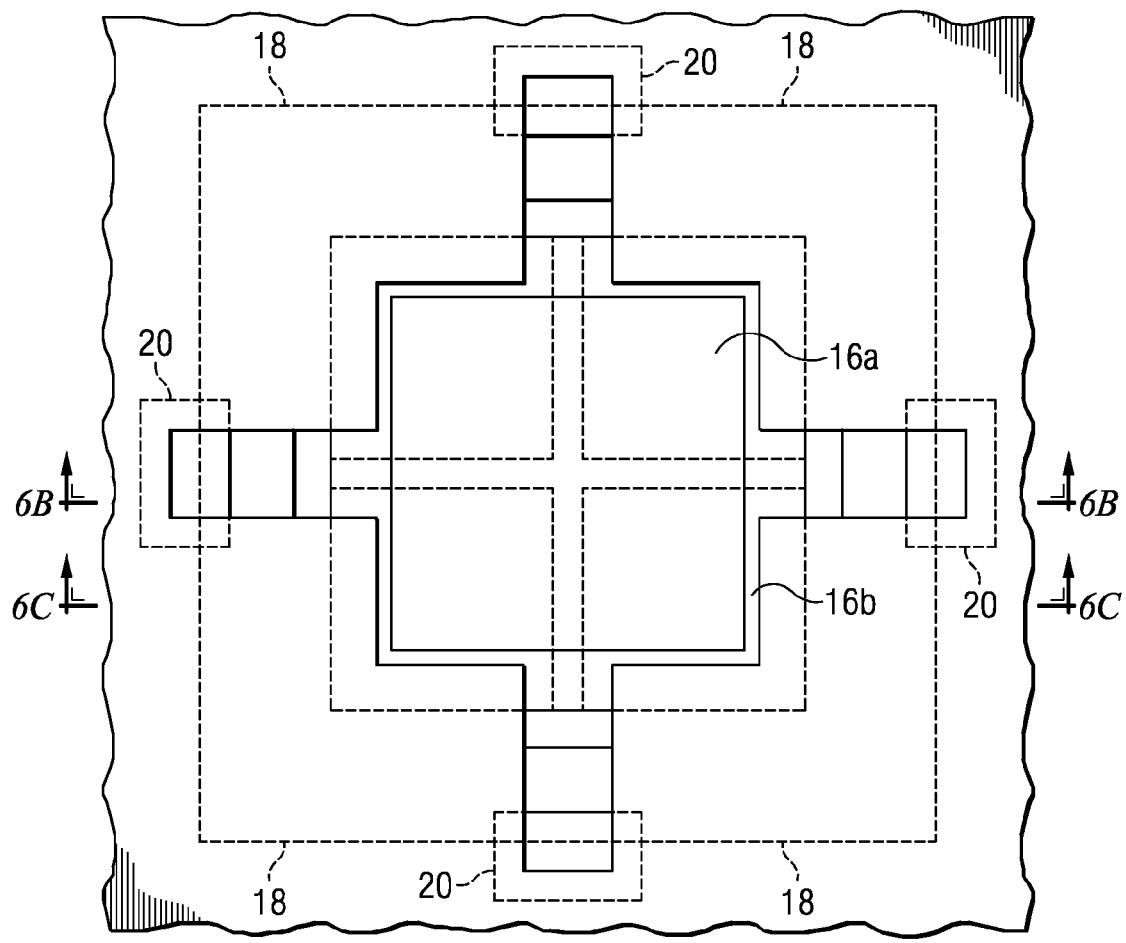
Figure 6B:
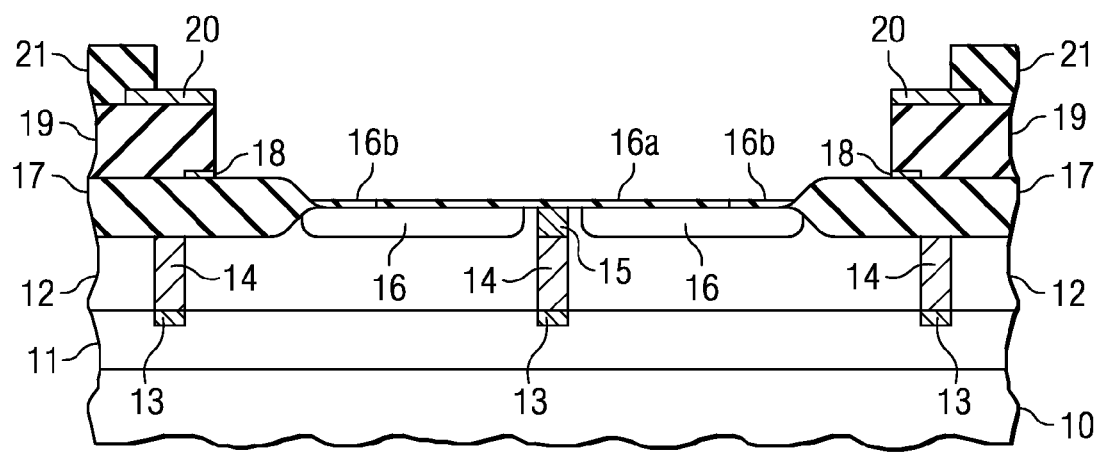
Figure 6C:
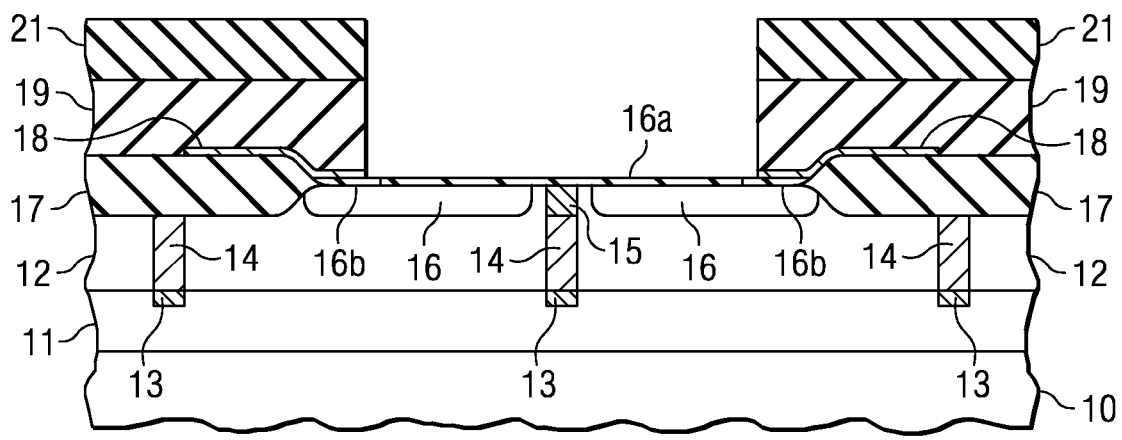

Then, as shown in FIGS. 6A-6C, after resist film R1 is removed, wet etching is performed as a second etching, with the first insulation film 19 and the second insulation film 21 used as an etch mask, to selectively remove uncovered portions of conductive layer 18. In the illustrated case, the etching solution used is such that mask layer 20 remains.

As a result of the etching, conductive layer 18 is formed in a pattern, which is connected to n+-type semiconductor region 16 that forms the second semiconductor layer along the outer periphery with respect to the four PIN photodiodes PD1-PD4, and which is divided for each of the PIN photodiodes PD1-PD4. However, since conductive layer 18 remains untouched in the region superposed with mask layer 20, the photodiodes are connected to each other as one body by the conductive layer 18 in that region.

Figure 7A:
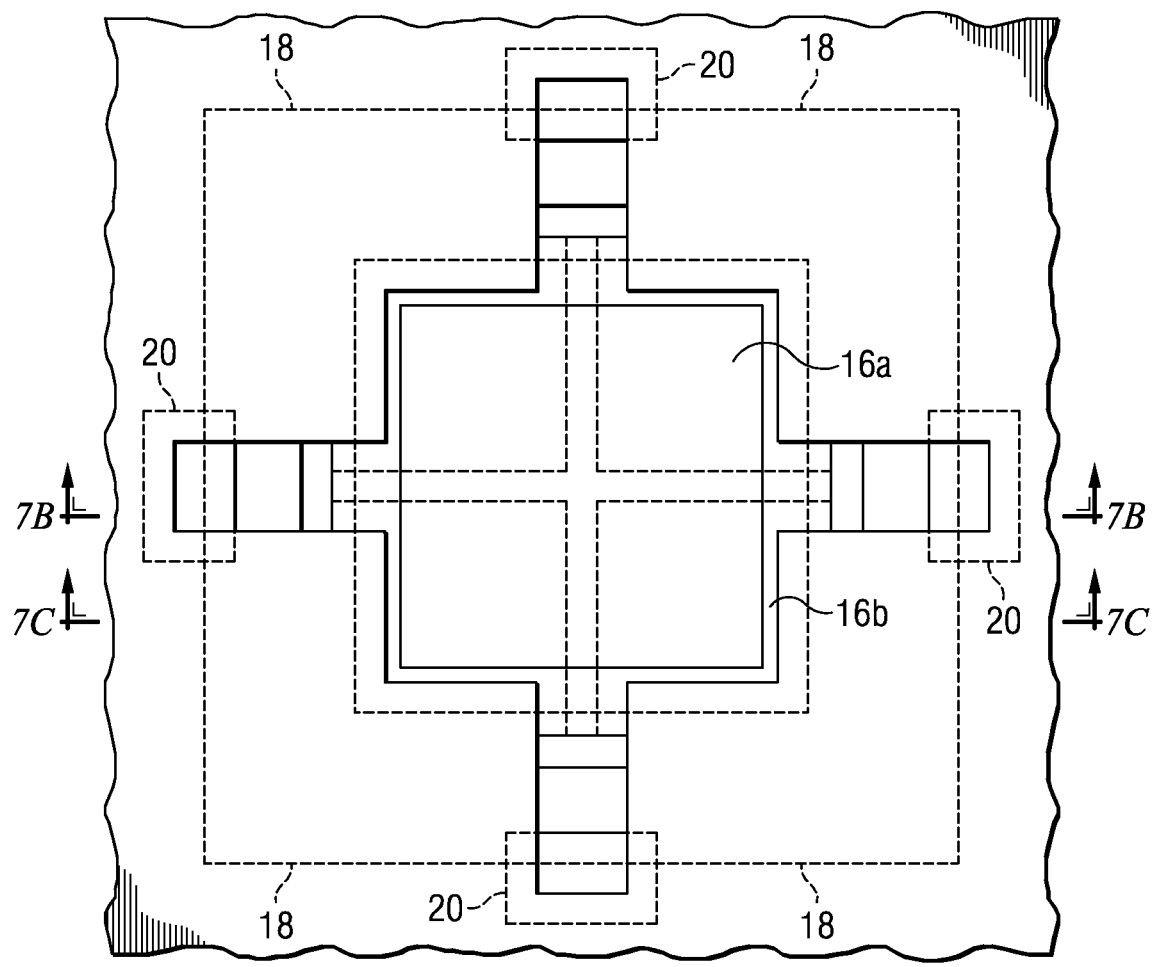
Figure 7B:
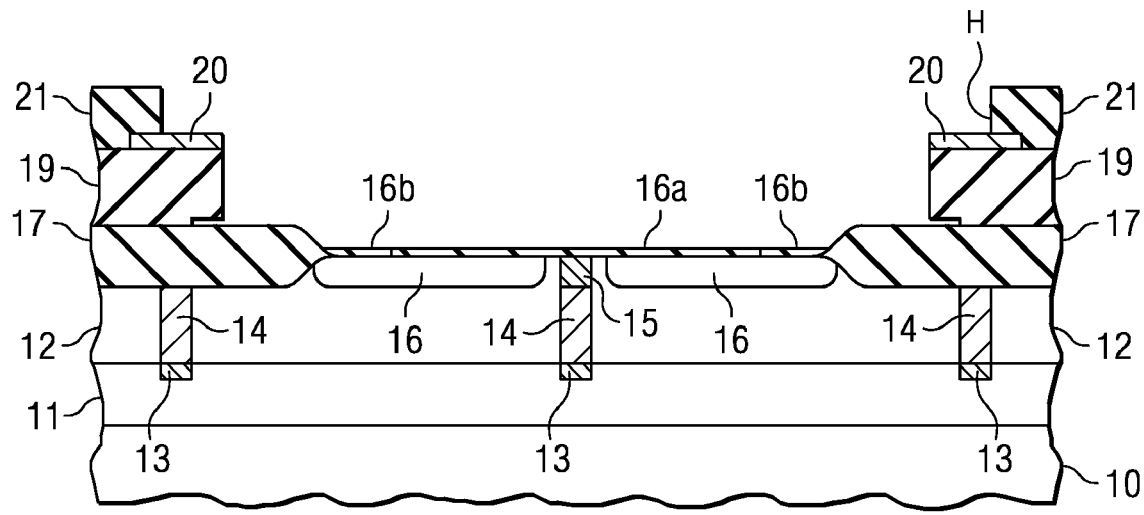
Figure 7C:
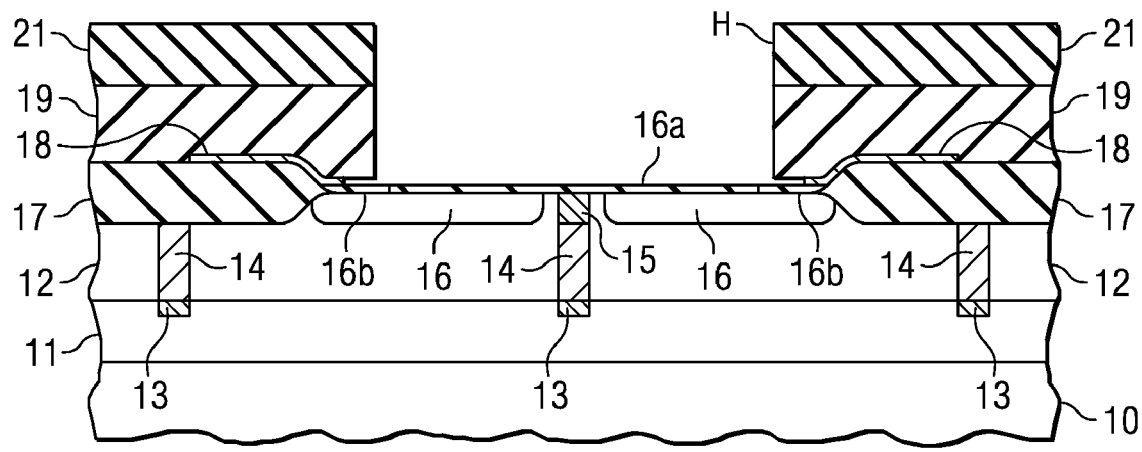

Then, as shown in the FIGS. 7A-7C, overetching is performed during the second etching to also carry out etching in the horizontal direction to recess conductive layer 18. In this way, the conductive layer 18 in the region superposed with mask layer 20 is removed. Conductive layer 18 is formed in a pattern, which is connected to n+-type semiconductor region 16 that forms the second semiconductor layer along the outer periphery with respect to the four PIN photodiodes PD1-PD4, and which is divided for each of the PIN photodiodes PD1-PD4.

After that, an insulation film, made of silicon nitride, etc., is deposited on the entire surface by means of CVD to form surface protective layer 22, thus resulting in the semiconductor device shown in the embodiment of FIGS. 1A-C.

For the described semiconductor device, even if the opening is formed in the insulation films 19 and 21 in order to improve the sensitivity as described in this manufacturing method, since the conductive layer 18 and the mask layer 20 are used as etch stop layers, leakage-causing damage can be prevented. And, since the conductive layer 18 connected to the second semiconductor layer that constitutes each photodiode is formed in a segmented pattern divided into a separate segment for each photodiode, the photodiodes can be configured to not short circuit. Although the described used etching solution is such that mask layer 20 is not removed during the second etching, it is also possible to remove conductive layer 18 and mask layer 20 at the same time.

Second Embodiment

Figure 8A:
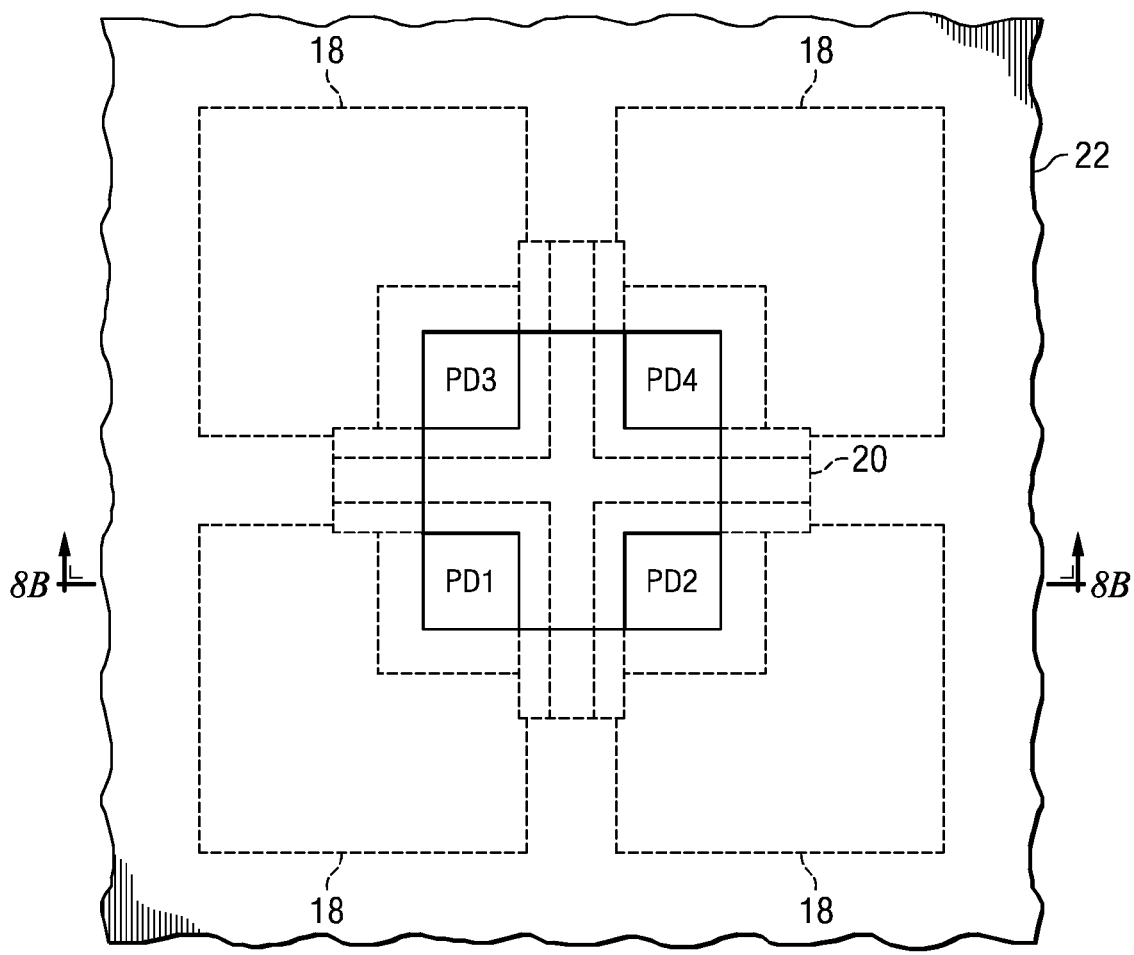
FIG. 8A is a plan view and FIG. 8B is a section view, taken along the section line 8B-8B of FIG. 8A, of a semiconductor device according to a second embodiment of the invention.
Figure 8B:
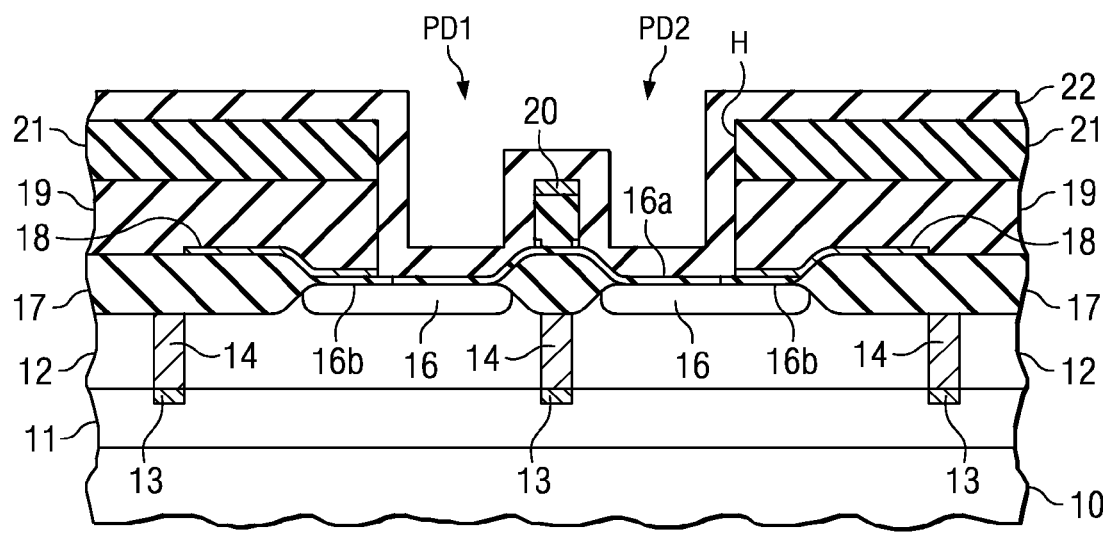

A second example embodiment of a semiconductor device is illustrated in FIGS. 8A and 8B.

Like the first embodiment, the semiconductor device disclosed in this embodiment has four photodiodes formed adjacent to each other via element-separating regions. Four PIN photodiodes PD1-PD4 are formed in the same way as described for the first embodiment. In this embodiment, however, LOCOS element-separating insulation film 17 is also formed in the regions that separate the four PIN photodiodes PD1-PD4.

As shown in FIGS. 8A and 8B, the second semiconductor layer of the second conductivity type (n type epitaxial layer 12 and n+-type semiconductor region 16) is formed on the main surface of the first semiconductor layer of the first conductivity type (p++-type silicon semiconductor substrate 10 and p--type epitaxial layer 11). Silicon nitride layer 16a is formed on the surface at the central part of n+-type semiconductor region 16. Silicide layer 16b, made of platinum silicide, etc., is formed on the surface near the edge of n+-type semiconductor region 16a, which is the outer periphery of silicon nitride layer 16a. The device is separated by element-separating regions comprised of p+++-type semiconductor regions 13, 14 and LOCOS element-separating insulation film 17. In this way, four approximately square PIN photodiodes PD1-PD4 are formed adjacent to each other. The outer periphery of the entire device has an approximately square shape. Each side of each PIN photodiode PD1-PD4 has a length of, for example, approximately several microns to tens of microns. Each side of the approximately square device comprised of the four integrated photodiodes has a length of, for example, about 40 μm. The intervals between the PIN photodiodes are reduced to about 5 μm or less.

Conductive layer 18, made of Al/TiW or other metal, is formed via silicide layer 16b on n+-type semiconductor region 16 in a pattern, which is connected to n+-type semiconductor region 16 that forms the second semiconductor layer along the outer periphery with respect to all of said four PIN photodiodes PD1-PD4, and which is divided for each of the PIN photodiodes PD1-PD4. In other words, each PIN photodiode PD1-PD4 has an approximately square shape, and conductive layer 18 is formed in a pattern connected to n+-type semiconductor region 16 via silicide layer 16b on two sides of each square. In the illustrated case, conductive layer 18 is also formed on the element-separating regions between the adjacent PIN photodiodes.

The first insulation layer 19, made of silicon oxide, etc., is formed on the entire surface to cover conductive layer 18. A mask layer 20, made of TiN/Al/TiN, for example, is formed on the first insulation layer 19 in a pattern having regions superposed with conductive layer 18 on the element-separating region between the adjacent PIN photodiodes. In the illustrated case, the four PIN photodiodes PD1-PD4 are separated by a cross-shaped element-separating region. The mask layer 20 formed in this region is also formed in a cross shape.

The second insulation layer 21, made of silicon oxide, etc., is then formed on the first insulation film 19. An opening H, which reaches silicon nitride layer 16a and silicide layer 16b on n+-type semiconductor region 16 that forms the second semiconductor layer, is formed in the first insulation layer 19 and the second insulation layer 21 in the region surrounded by the pattern of conductive layer 18 and mask layer 20 on the inner side of conductive layer 18. The second insulation film 21 is completely removed in the opening H. The first insulation film 19 is also removed except for the part below mask layer 20. A surface protective layer 22 is formed to cover the area inside opening H.

For the four PIN photodiodes PD1-PD4 with the described configuration, since conductive layer 18 is connected to n+-type semiconductor region 16 via silicide layer 16b, a voltage can be applied to n+-type semiconductor region 16 via conductive layer 18.

A method of manufacturing the semiconductor device shown in FIGS. 8A and 8B is described with reference to FIGS. 9A-13B.

Figure 9A:
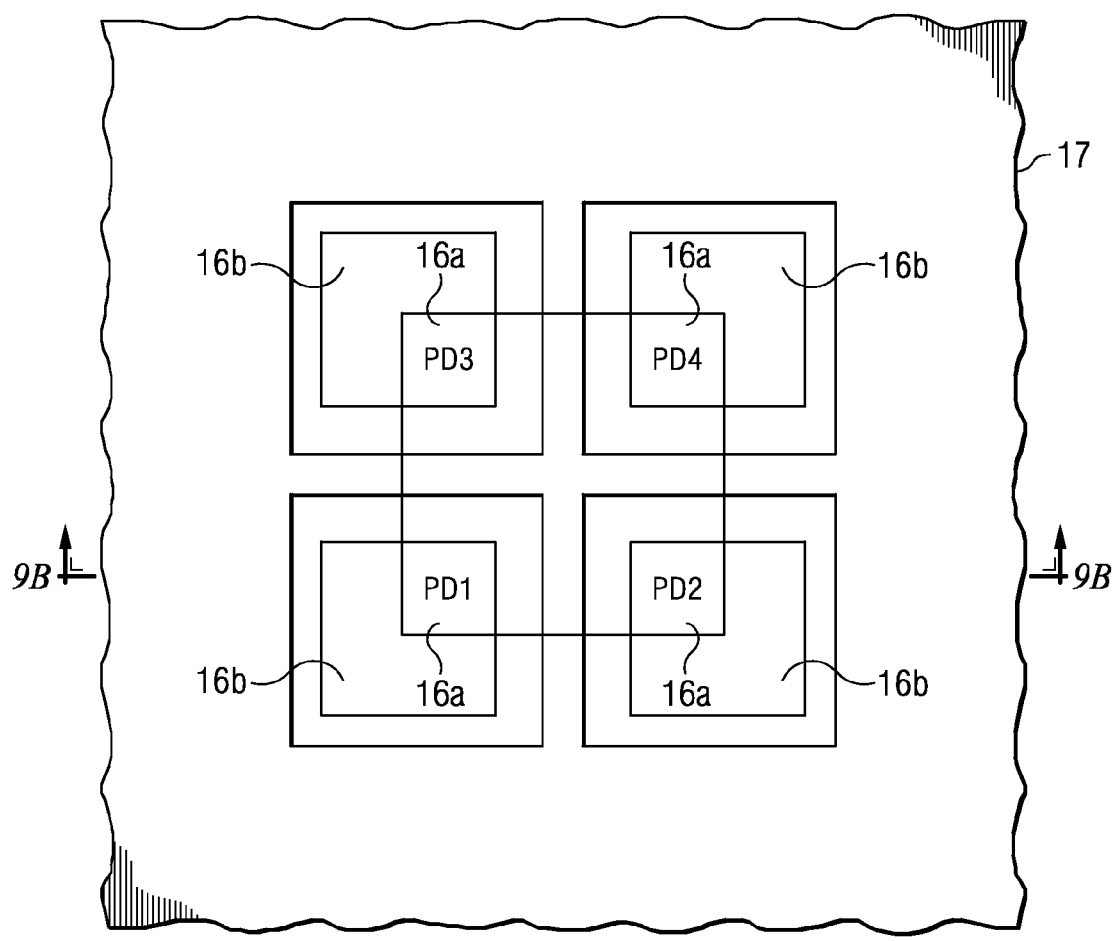
FIGS. 9A, 10A, 11A, 12A and 13A are plan views
Figure 9B:
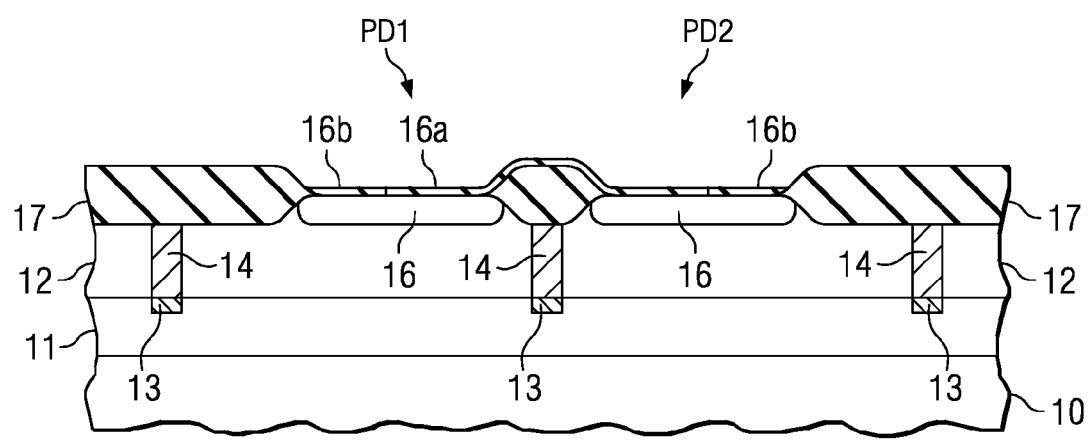
FIGS. 9B, 10B, 11B, 12B and 13B are section views, respectively taken along section lines identified by their figure numbers in the corresponding plan views, illustrating various steps in a process for the manufacture of the semiconductor device of FIGS. 8A and 8B.

As shown in FIGS. 9A and 9B, four approximately square-shaped PIN photodiodes PD1-PD4 are formed adjacent to each other in the same way as described for the first embodiment. In this case, however, LOCOS element-separating insulation film 17 is also formed in the region that separates the four PIN photodiodes PD1-PD4.

Figure 10A:
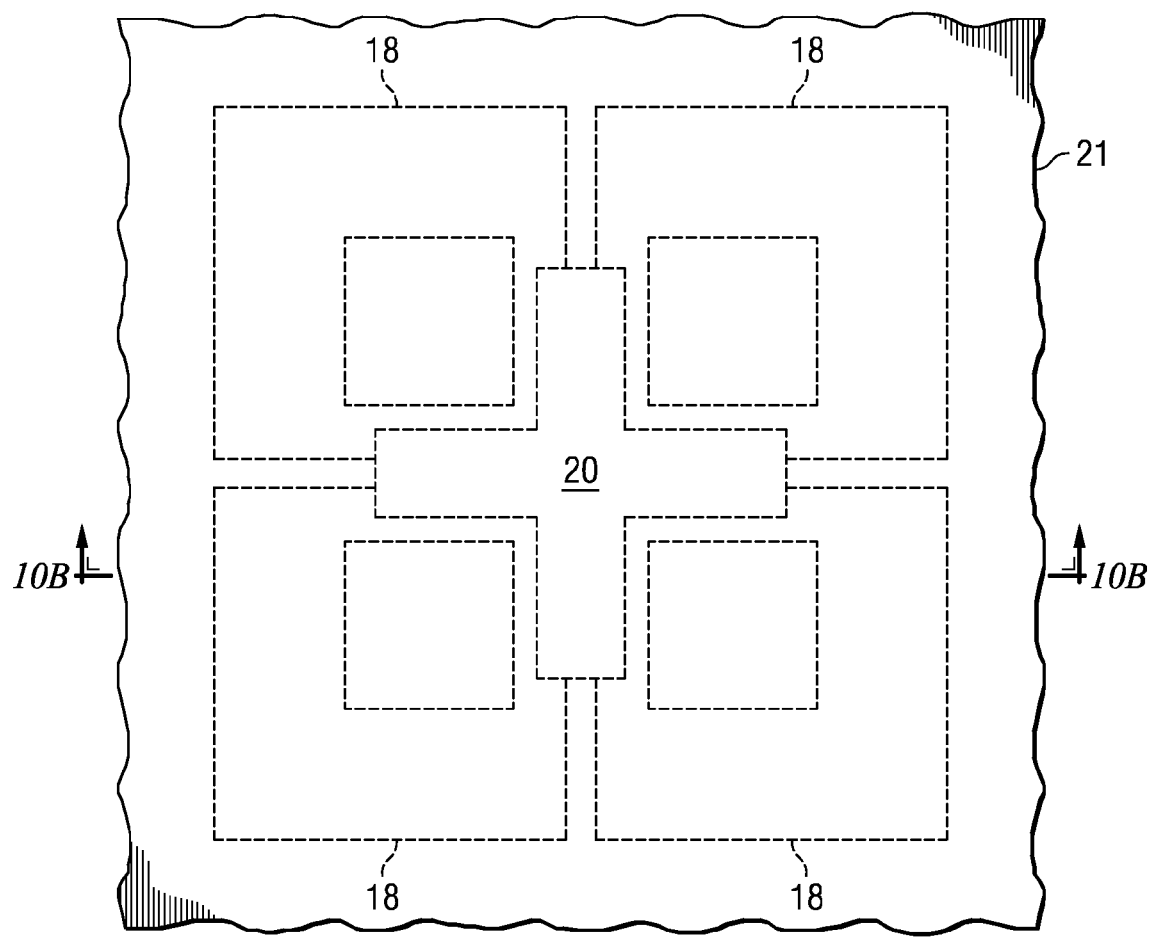
Figure 10B:
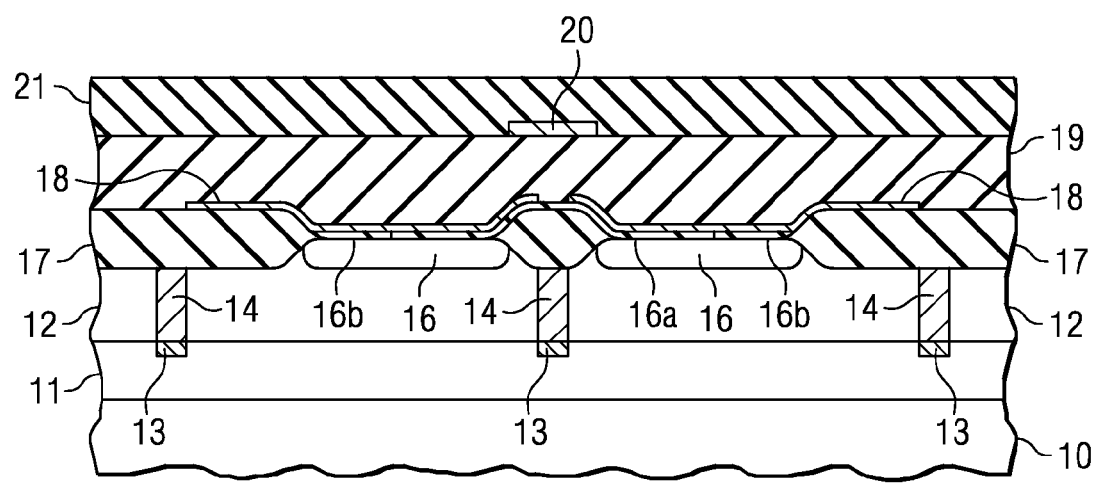

As shown in FIGS. 10A and 10B, a metal layer of Al/TiW, etc., is deposited by means of sputtering, for example, to a thickness of 200-300 nm on the entire surface to cover silicon nitride layer 16a and silicide layer 16b on n+-type semiconductor region 16, followed by patterning to form conductive layer 18, which is separated for each of the four PIN photodiodes PD1-PD4 and covers up to the area on the element-separating region between the adjacent PIN photodiodes. Next, the first insulation film 19 is formed on the entire surface to cover conductive layer 18. The first insulation film 19 is formed as a single layer or as a plurality of laminated layers by depositing silicon oxide by CVD with TEOS used as the raw material, or by depositing a BPSG film, or by depositing silicon nitride by CVD. Then, TiN/Al/TiN, etc., is deposited to a thickness of 200-300 nm on the first insulation film 19 by sputtering, for example, followed by patterning to form mask layer 20 having regions superposed with conductive layer 18 on the element-separating regions between the adjacent PIN photodiodes. Like the first insulation film 19, the second insulation film 21 is formed on the entire surface to cover mask layer 20.

Figure 11A:
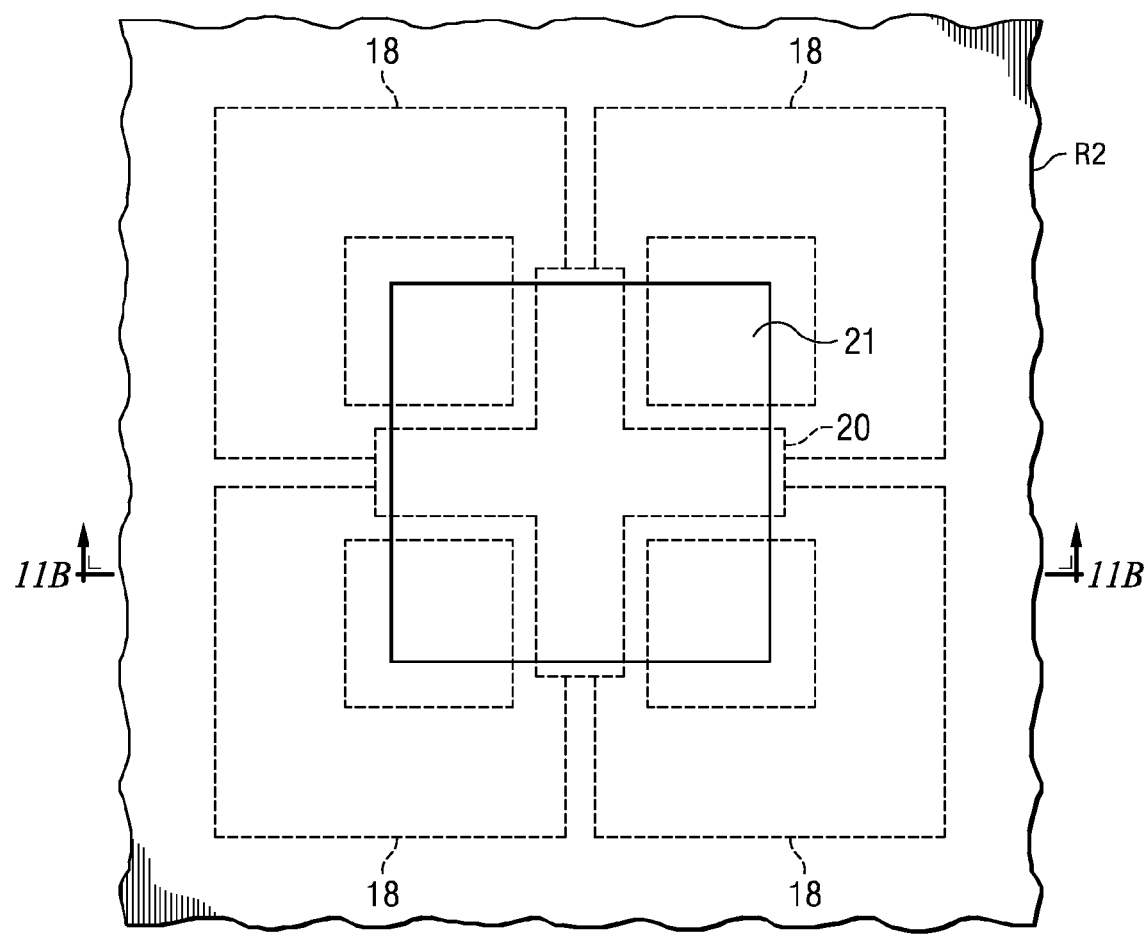
Figure 11B:
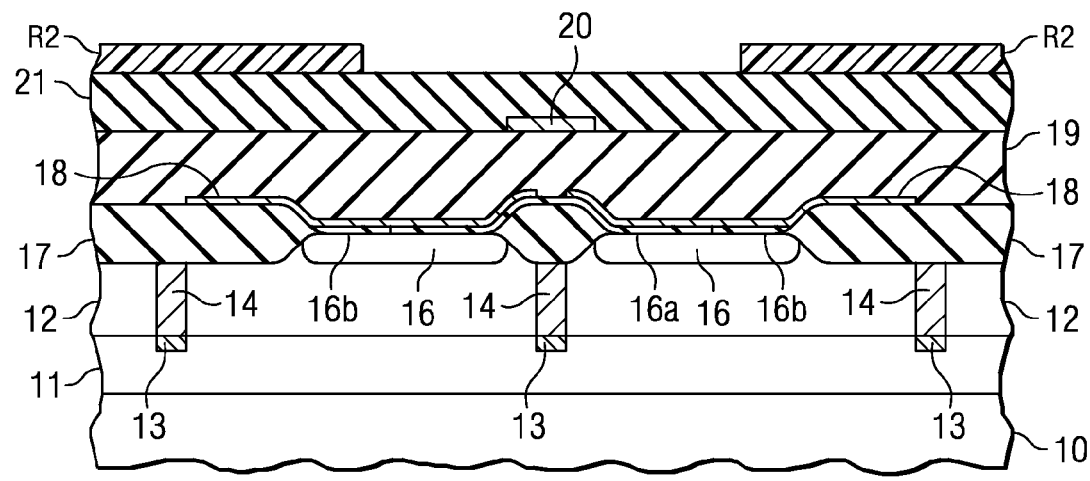

Then, as shown in FIGS. 11A and 11B, a resist film R2 is formed in such a pattern that conductive layer 18 and/or mask layer 20 is present at any position in the opening area.

Figure 12A:
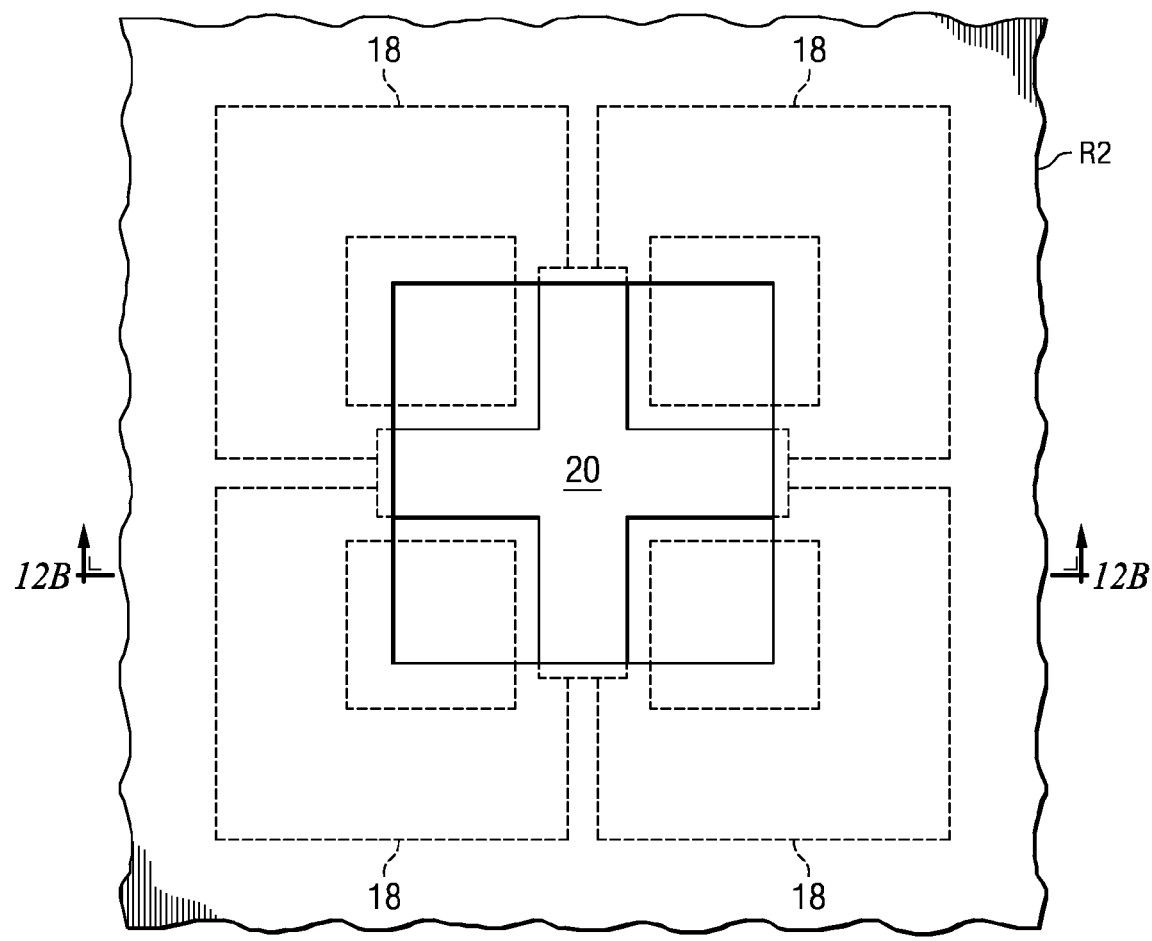
Figure 12B:
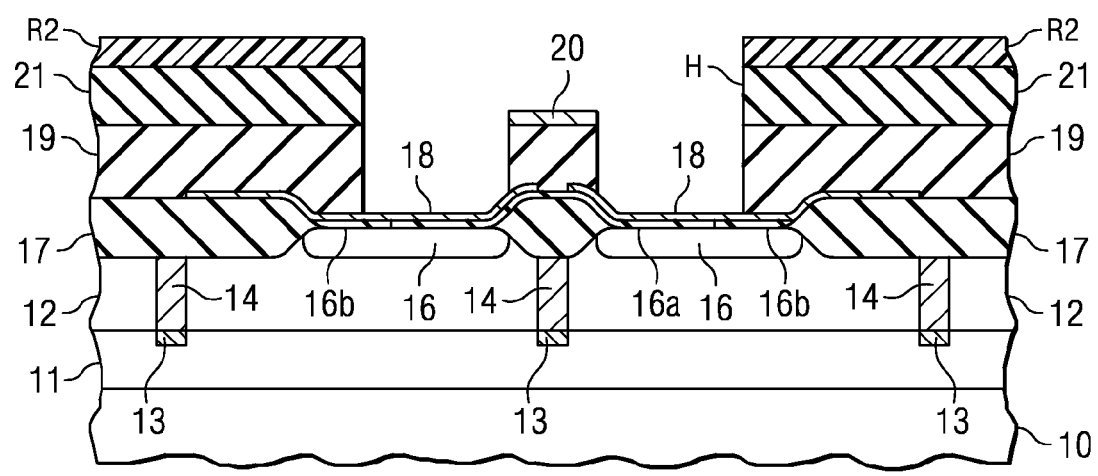

Next, as shown in FIGS. 12A and 12B, for example, dry etching (such as reactive ion etching) is performed as the first etching to form opening H in the first insulation layer 19 and the second insulation layer 21, with conductive layer 18 and mask layer 20 used as etch stop layers. This exposes conductive layer 18 and mask layer 20 in the opening H. In the illustrated case, there is a region where conductive layer 18 is not formed on the element-separating region between the PIN photodiodes in the opening region of resist film R2. However, since mask layer 20 stops the etching, the etch of opening part H does not form a tunnel into element-separating insulating film 17.

Figure 13A:
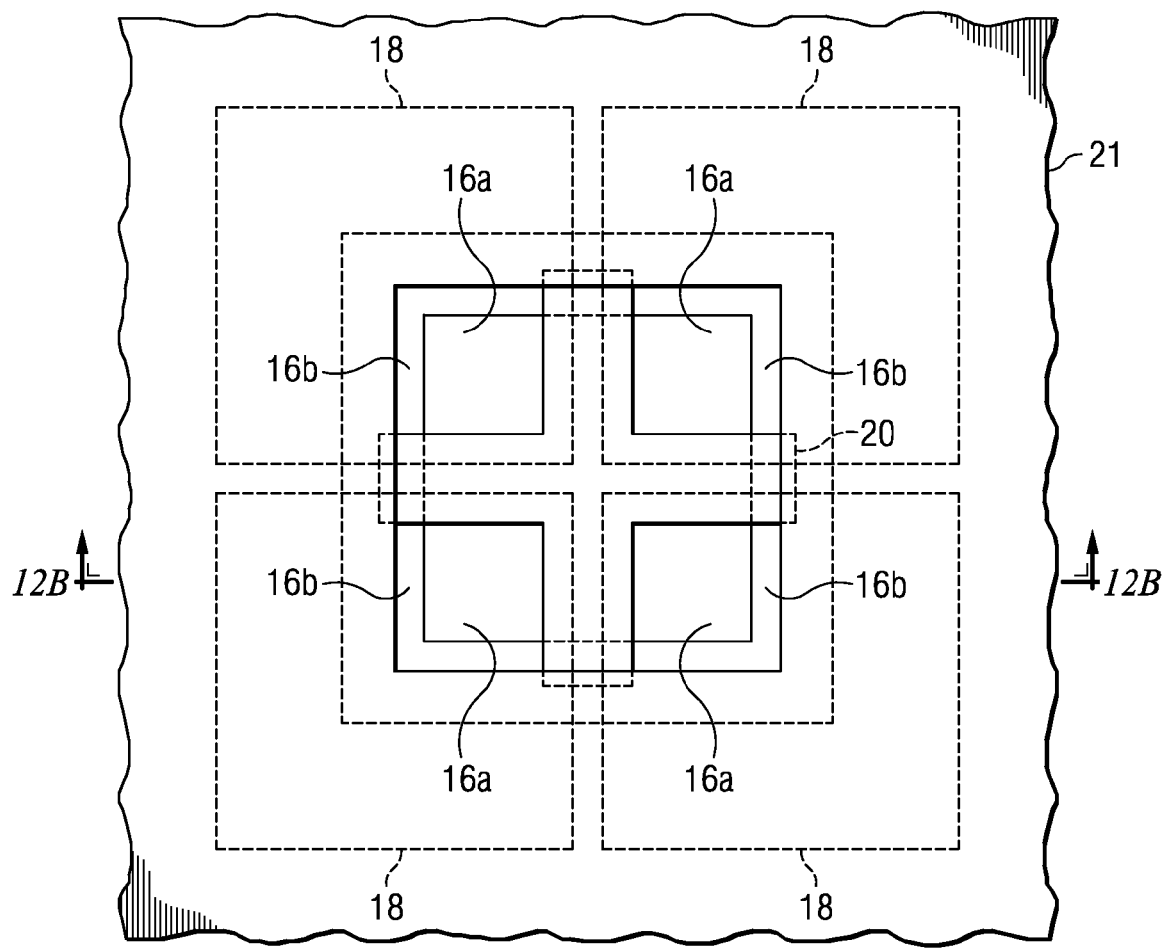
Figure 13B:
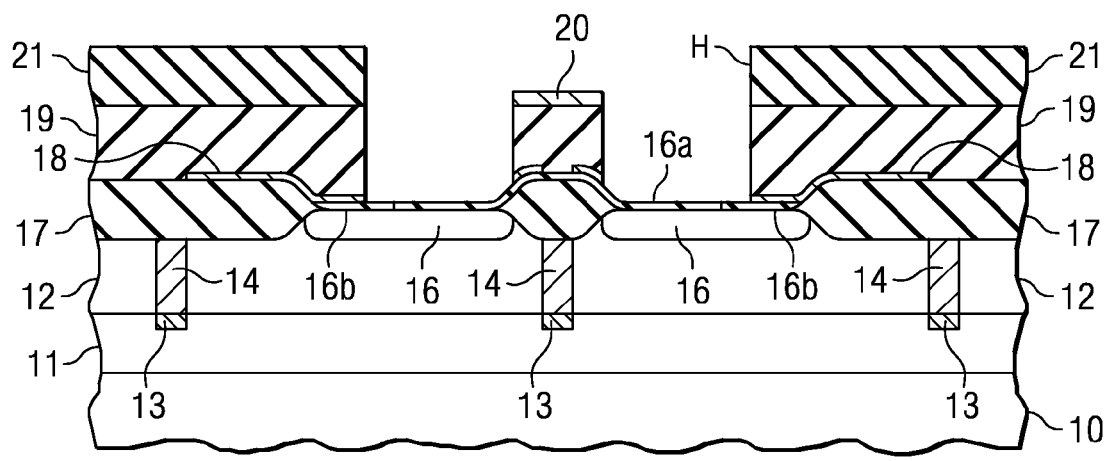

As shown in FIGS. 13A and 13B, after resist film R2 is removed, wet etching is performed as the second etching to remove conductive layer 18, with the first insulation film 19 and the second insulation film 21 used as etch stop layers. In this case, the etching solution used is such that mask layer 20 remains.

As a result of the etching, an opening, which exposes silicon nitride layer 16a and silicide layer 16b on n+ semiconductor region 16, is formed with respect to each part of conductive layer 18. Each segment of conductive layer 18 remains partially on the element-separating region between the adjacent PIN photodiodes, which is the region superposed with mask layer 20. However, since conductive layer 18 is separated into respective segments for the PIN photodiodes when it is formed as described, short circuits will not occur. It is also possible to perform overetching during the second etching to completely remove the conductive layer 18 on the element-separating regions between the PIN photodiodes.

After that, an insulation film, made of silicon nitride, etc., is deposited on the entire surface by means of CVD to form surface protective layer 22, thus giving a structure such as the second embodiment shown in FIGS. 8A and 8B.

For the semiconductor device disclosed in the second embodiment, even if the opening is formed in the insulation film in order to improve the sensitivity as described in this manufacturing method, since the conductive layer and the mask layer are used as etch stop layers, leakage-causing damage can be prevented. And, since the conductive layer connected to the second semiconductor layer that constitutes each photodiode is formed in a pattern divided into a segment for each photodiode, the photodiodes can be configured so that they do not short circuit.

In the described embodiment, although an etching solution that does not remove mask layer 20 during the second etching, it is also possible to remove the mask layer 20 at the same time.

Third Embodiment

Figure 14A:
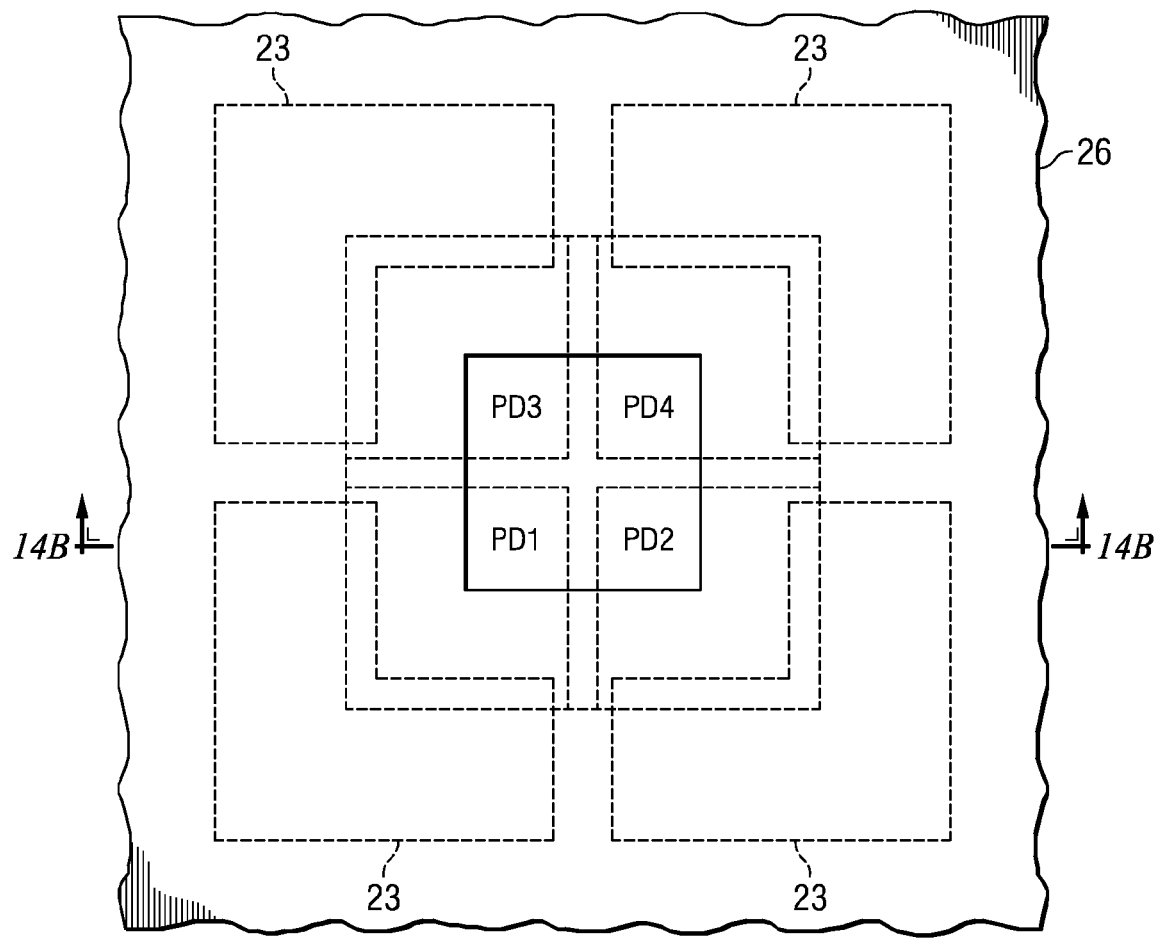
FIG. 14A is a plan view and FIG. 14B is a section view, taken along the section line 14B-14B of FIG. 14A, of a semiconductor device according to a third embodiment of the invention.
Figure 14B:
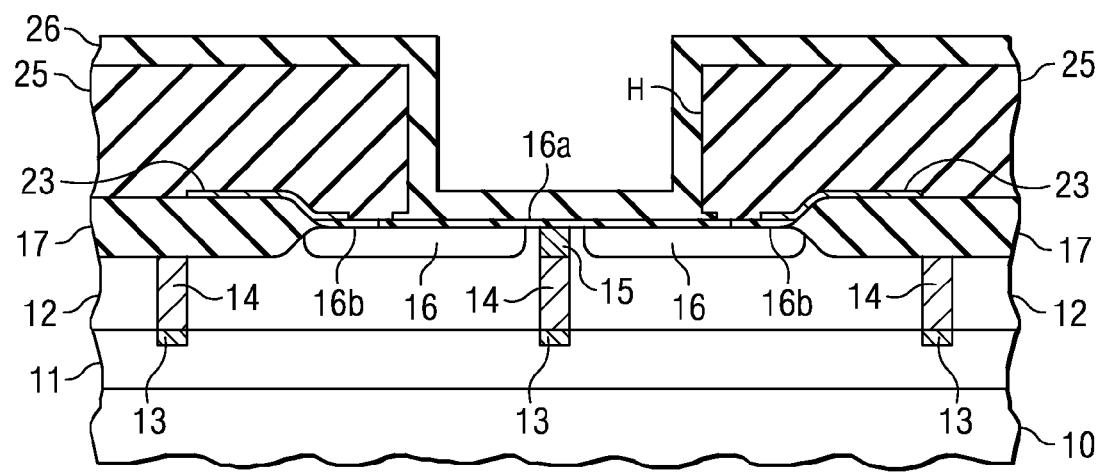

A third example embodiment of a semiconductor device is illustrated in FIGS. 14A and 14B.

The semiconductor device disclosed in this embodiment has four photodiodes PD1-PD4 formed adjacent to each other via element-separating regions in the same way as described in the first embodiment. Four PIN photodiodes PD1-PD4 are formed in the same way described previously for the first embodiment.

As shown in FIGS. 14A and 14B, the second semiconductor layer of the second conductivity type (n type epitaxial layer 12 and n+-type semiconductor region 16) is formed on the main surface of the first semiconductor layer of the first conductivity type (p++-type silicon semiconductor substrate 10 and p− type epitaxial layer 11). Silicon nitride layer 16a is formed on the surface at the central part of n+-type semiconductor region 16. Silicide layer 16b, made of platinum silicide, etc., is formed on the surface near the edge of n+-type semiconductor region 16, which is the outer periphery of silicon nitride layer 16a. The device is separated by element-separating regions comprised of p++-type semiconductor regions 13, 14, 15 and LOCOS element-separating insulation film 17. In this way, four approximately square PIN photodiodes PD1-PD4 are formed adjacent to each other. The outer periphery of the entire device has an approximately square shape. The side of each PIN photodiode PD1-PD4 has a length of, for example, approximately several microns to tens of microns. Each side of the approximately square device comprised of the four integrated photodiodes has a length of, for example, about 40 μm. The intervals between the PIN photodiodes are reduced to about 5 μm or less.

Conductive layer 23, made of Al/TiW or other metal, is formed via silicide layer 16b on n+-type semiconductor region 16 in a pattern, which is connected to n+-type semiconductor region 16 that forms the second semiconductor layer via silicide layer 16b along the outer periphery with respect to all four PIN photodiodes PD1-PD4, and which is divided into separate segments for each of PIN photodiodes PD1-PD4. In other words, each of PIN photodiodes PD1-PD4 has an approximately square shape, and conductive layer 23 is formed in a pattern connected to n+-type semiconductor region 16 via silicide layer 16b, with inside sides of respective L-shaped segments overlapping respective one of two outside sides of each square.

An insulation layer 25, made of silicon oxide, etc., is formed on the entire surface to cover conductive layer 23. An opening H, which reaches down to silicon nitride layer 16a and silicide layer 16b on n+-type semiconductor region 16 that forms the second semiconductor layer, is formed in insulation layer 25 in the region inside the pattern of conductive layer 23. Also, a surface protective layer 26 is formed to cover the area inside the opening H.

For the four PIN photodiodes PD1-PD4 with the described configuration, since conductive layer 23 is connected to n+-type semiconductor region 16 via silicide layer 16b, a voltage can be applied to n+-type semiconductor region 16 via conductive layer 23.

Steps in a method of manufacturing the semiconductor device of FIGS. 14A and 14B are illustrated in FIGS. 15A-19B.

Figure 15A:
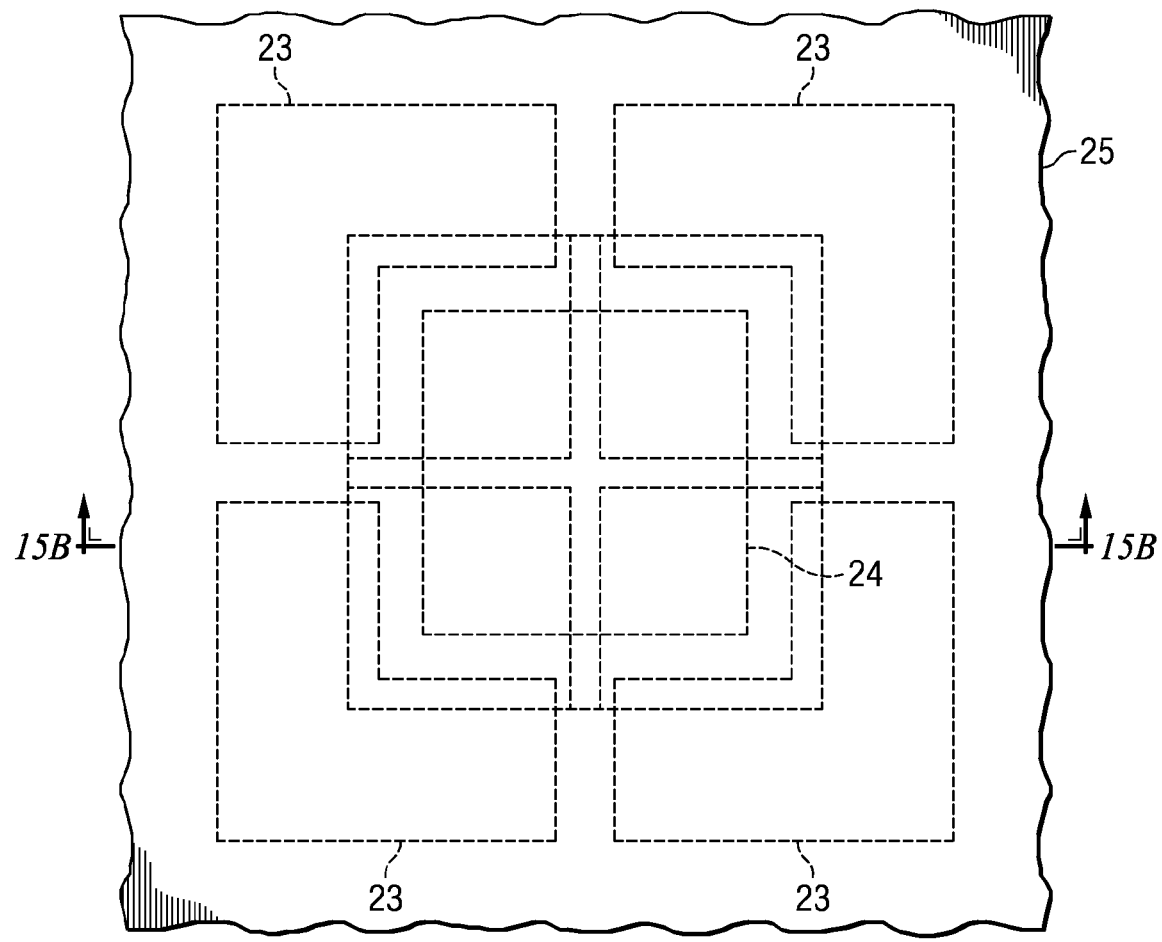
FIGS. 15A, 16A, 17A, 18A and 19A are plan views
Figure 15B:
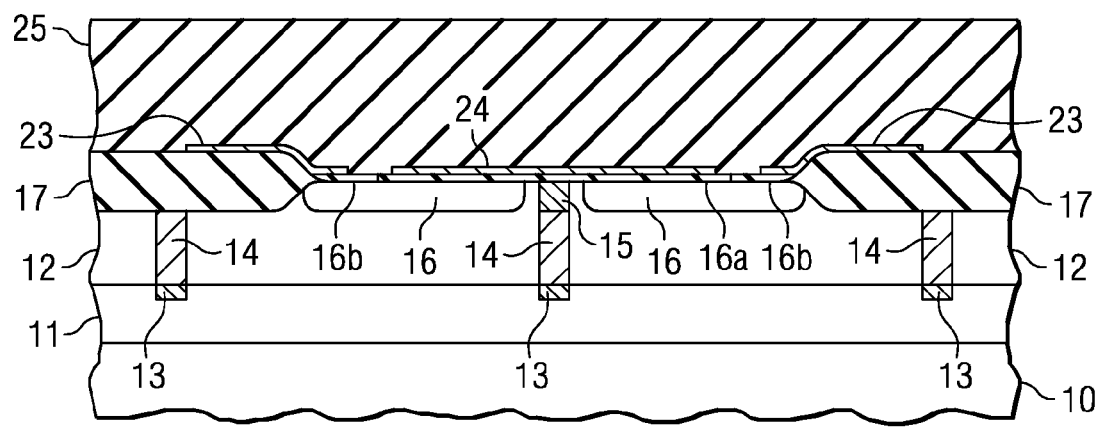
FIGS. 15B, 16B, 17B, 18B and 19B are section views, respectively taken along section lines identified by their figure numbers in the corresponding plan views, illustrating various steps in a process for the manufacture of the semiconductor device of FIGS. 14A and 14B.

As shown in FIGS. 15A and 15B, four approximately square-shaped PIN photodiodes PD1-PD4 are formed adjacent to each other in the same way as described previously in connection with the first embodiment. A metal layer, made of Al/TiW, etc., is deposited by means of sputtering to a thickness of about 200-300 nm on the entire surface to cover silicon nitride layer 16a and silicide layer 16b on n+-type semiconductor region 16, followed by patterning to form conductive layer 23, which is divided for each of PIN photodiodes PD1-PD4 and is connected to n+-type semiconductor region 16 that forms the second semiconductor layer via silicide layer 16b along the outer periphery with respect to all four of the PIN photodiodes PD1-PD4.

At the same time as patterning conductive layer 23, a mask layer 24 is formed in the region inside conductive layer 23 on n+-type semiconductor region 16 that forms the second semiconductor layer via silicon nitride layer 16a, by patterning the same metal layer, made of Al/TiW, etc., used for conductive layer 23. Insulation film 25 is then formed on the entire surface to cover conductive layer 23 and mask layer 24. The first insulation film 25 is formed as a single layer or as a plurality of laminated layers by depositing silicon oxide by CVD with TEOS used as the raw material, or by depositing a BPSG film, or by depositing silicon nitride by CVD.

Figure 16A:
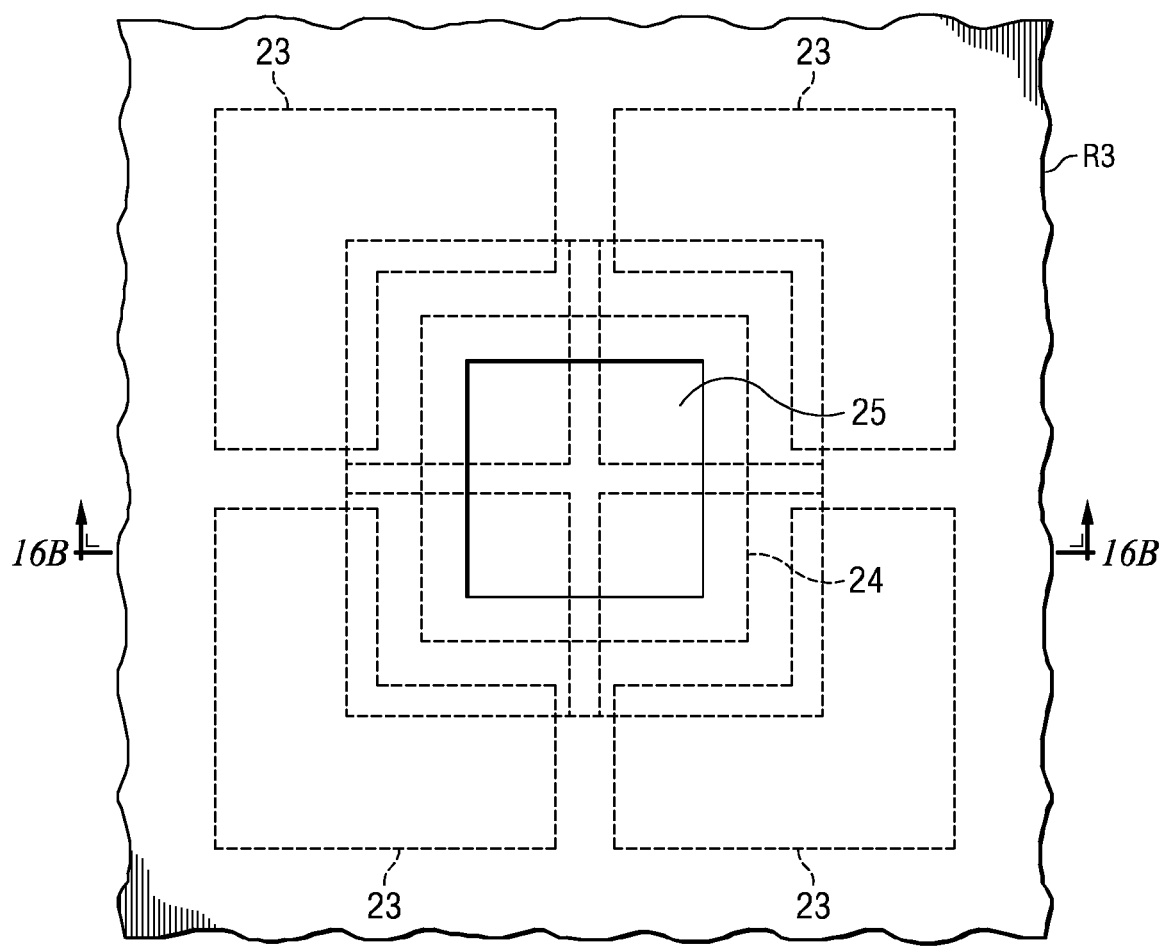
Figure 16B:
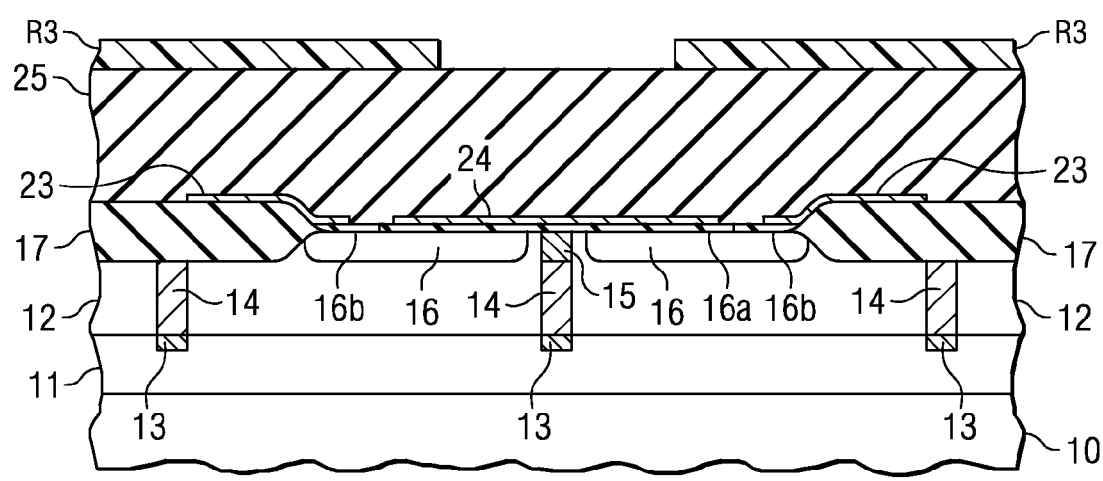
Figure 17A:
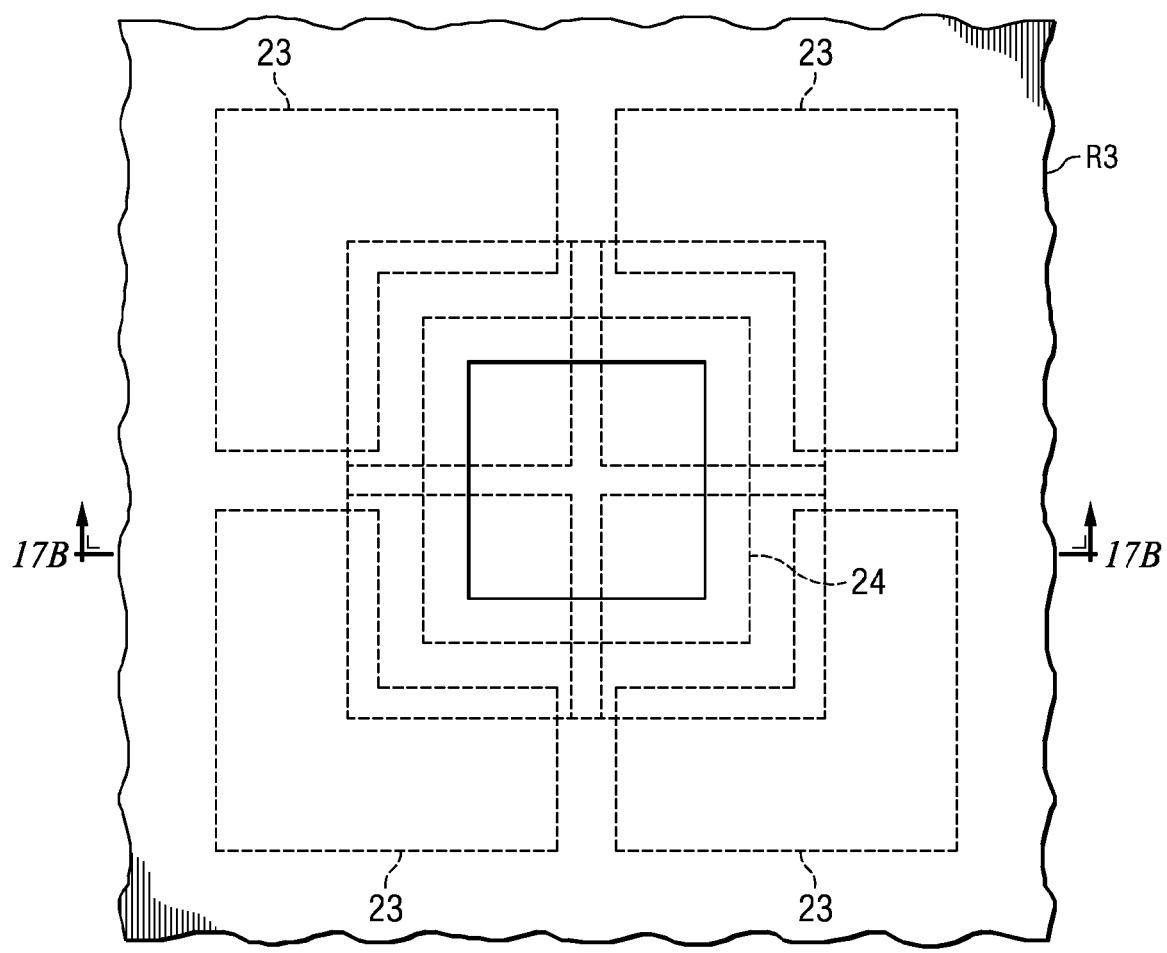
Figure 17B:
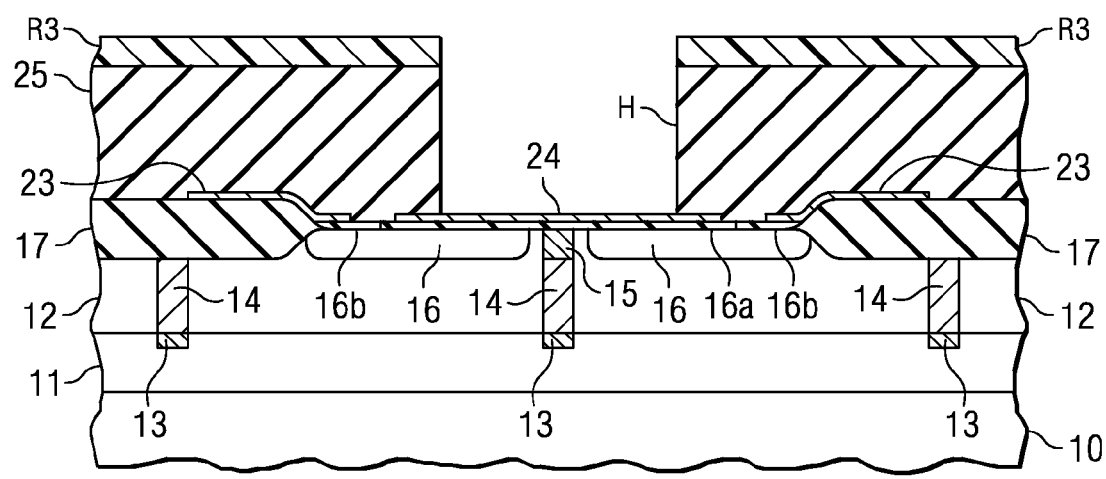

Next, as shown in FIGS. 16A and 16B, a resist film R3 is formed in a pattern that opens only in the region of mask layer 24. Then, as shown in FIGS. 17A and 17B, dry etching (such as reactive ion etching) is performed as the first etching with mask layer 24 used as an etch stop layer to form opening H in insulation layer 25, which exposes mask layer 24.

Figure 18A:
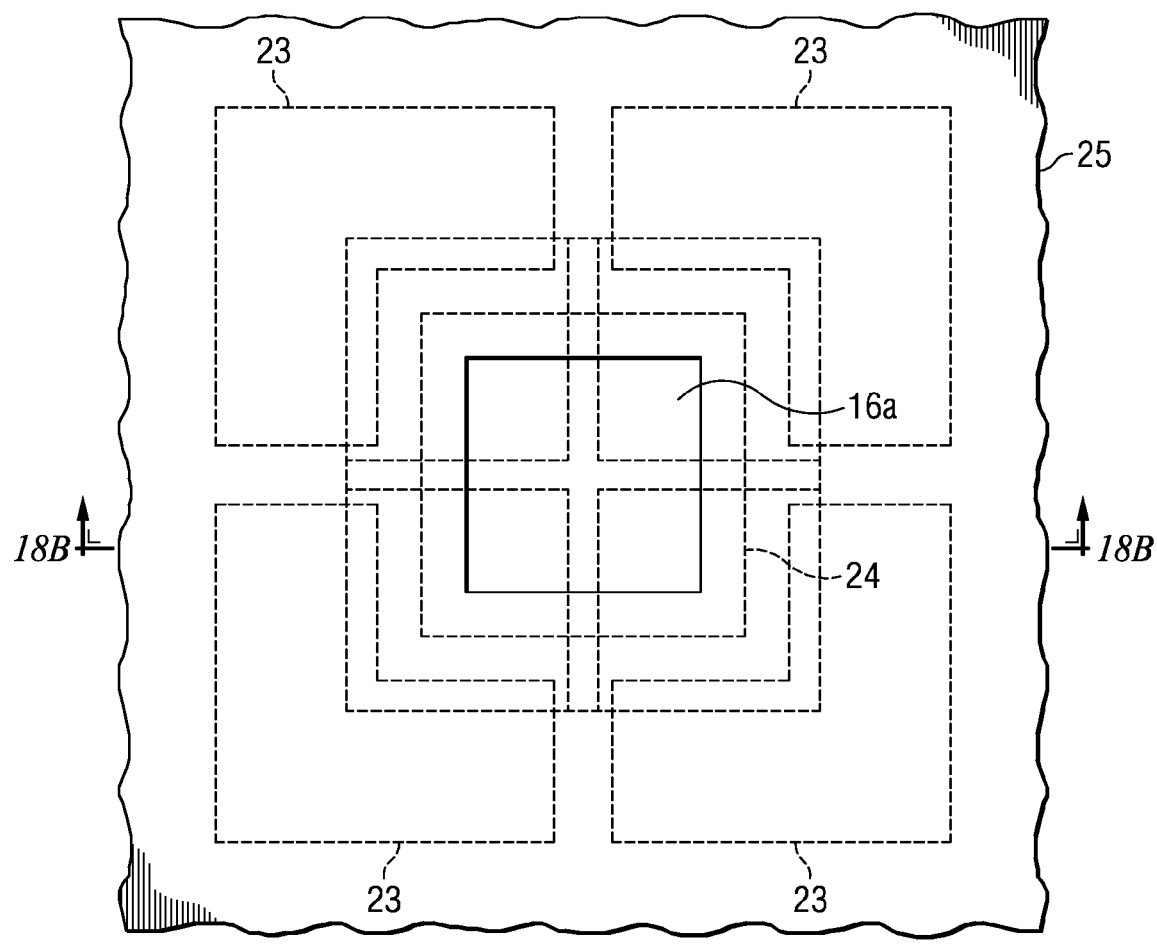
Figure 18B:
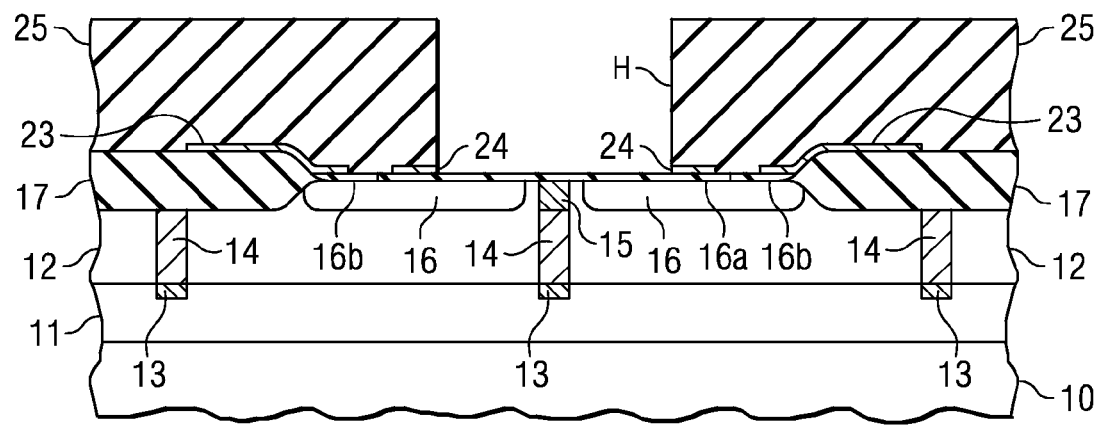

Then, as shown in FIGS. 18A and 18B, after resist film R3 is removed, wet etching is perform as the second etching to remove mask layer 24, with insulation film 25 used as etching mask. As a result of the second etching, mask layer 24 is left in a pattern, which is connected via silicon nitride layer 16a to n+-type semiconductor region 16 of the four PIN photodiodes PD1-PD4 in the region superposed with resist film R3.

Figure 19A:
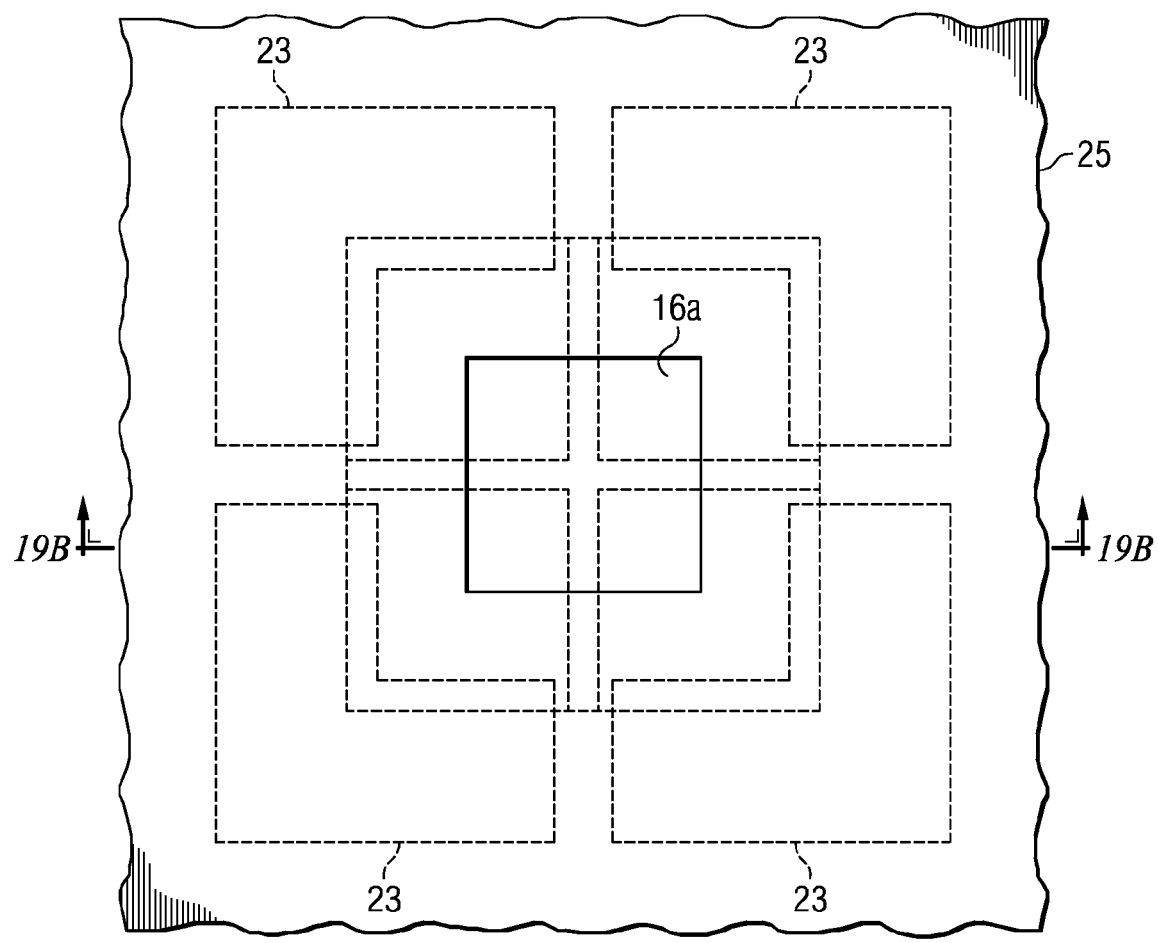
Figure 19B:
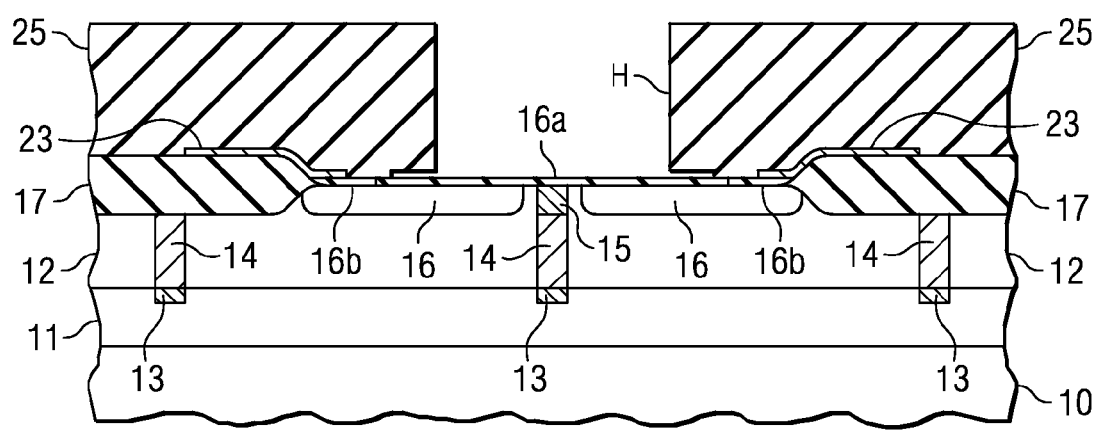

Then, as shown in FIGS. 19A and 19B, overetching is performed during the second etching to also carry out etching in the horizontal direction to remove mask layer 24. Because of the presence of silicon nitride layer 16a, there is no need to worry about short circuits even if mask layer 24 partially remains, as long as it is on the silicon nitride layer. After that, an insulation film made of silicon nitride is deposited by CVD to form surface protective layer 26, giving the semiconductor device shown in FIGS. 14A and 14B.

For the semiconductor device disclosed in the third embodiment, even if the opening is formed in the insulation film in order to improve the sensitivity as described in this manufacturing method, since the conductive layer and the mask layer are used as etching stopper, leakage-causing damage can be prevented. And, since the conductive layer connected to the second semiconductor layer that constitutes each photodiode is formed in a pattern divided for each photodiode, the photodiodes can be configured so as to not short circuit.

In this embodiment, the four PIN photodiodes are separated from each other by the p++-type semiconductor region. However, it is also possible to use the LOCOS element-separating insulation film in the same way as described in connection with the second embodiment.

Fourth Embodiment

Figure 20A:
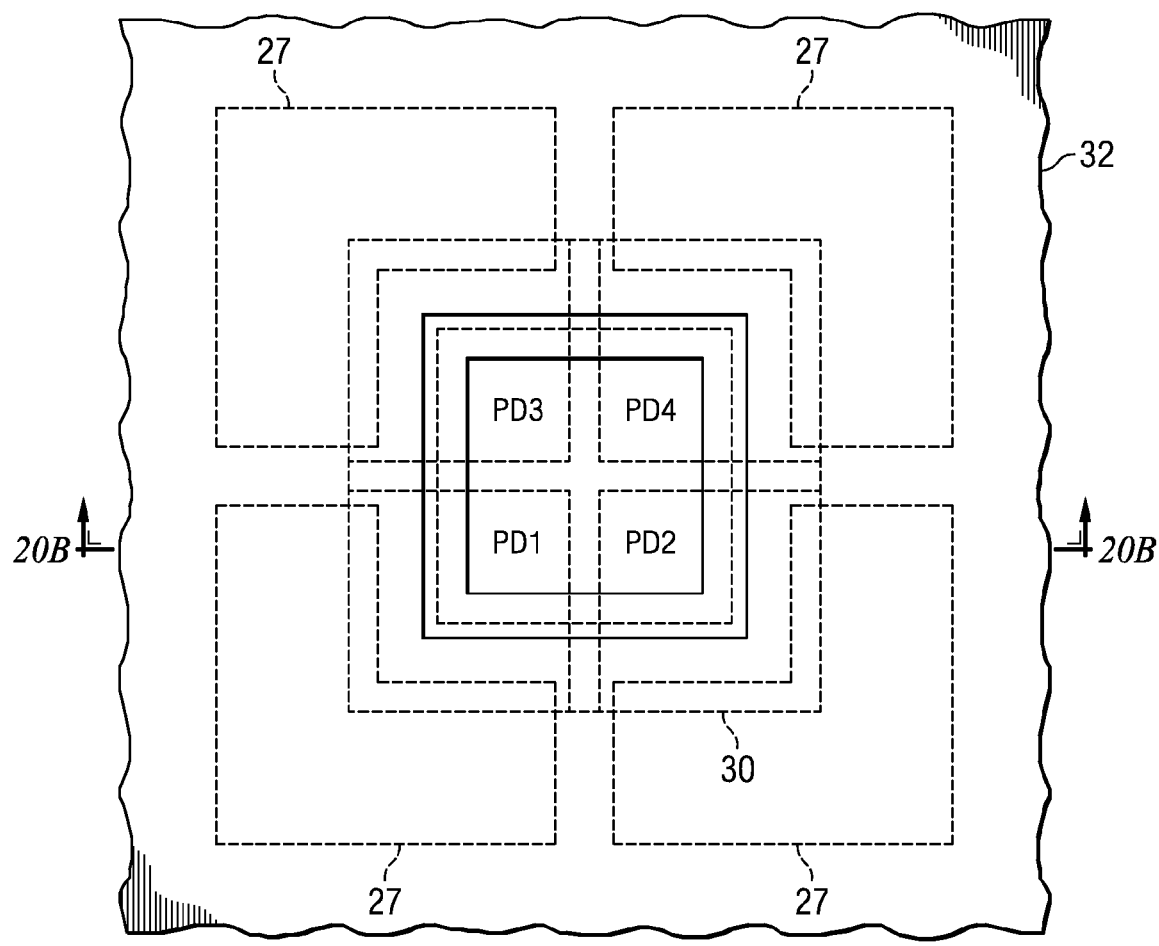
FIG. 20A is a plan view and FIG. 20B is a section view, taken along the section line 20B-20B of FIG. 20A, of a semiconductor device according to a fourth embodiment of the invention.
Figure 20B:
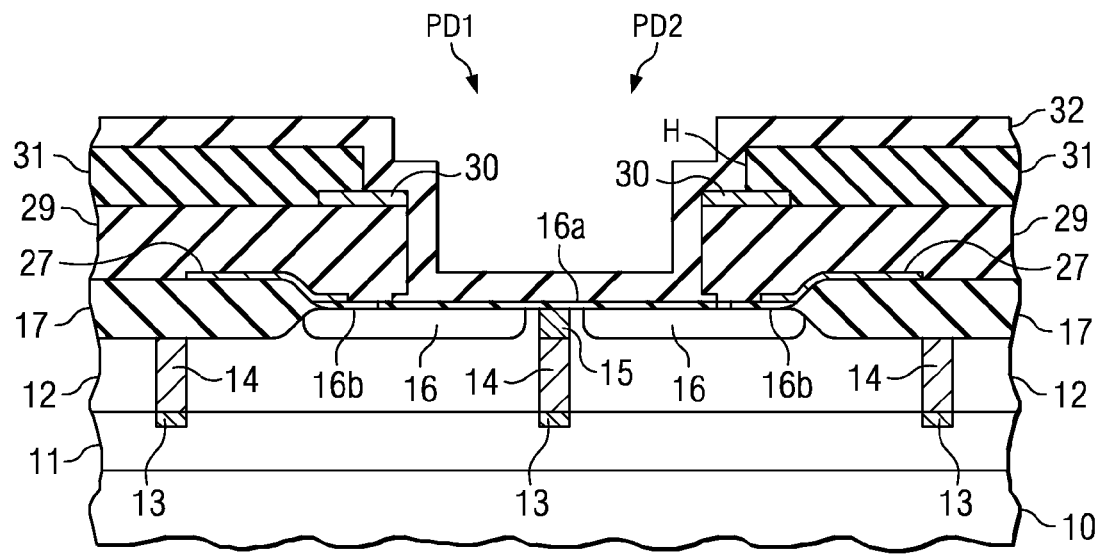

A fourth example embodiment of a semiconductor device is illustrated in FIGS. 20A and 20B.

The semiconductor device disclosed in this embodiment has four photodiodes formed adjacent to each other via element-separating regions in the same way as described in the first embodiment. Four PIN photodiodes PD1-PD4 are formed in the same way previously described in connection with the first embodiment.

As shown in FIGS. 20A and 20B, the second semiconductor layer of the second conductivity type (n type epitaxial layer 12 and n+-type semiconductor region 16) is formed on the main surface of the first semiconductor layer of the first conductivity type (p++-type silicon semiconductor substrate 10 and p– type epitaxial layer 11). Silicon nitride layer 16a is formed on the surface at the central part of n+-type semiconductor region 16. Silicide layer 16b, made of platinum silicide, etc., is formed on the surface near the edge of n+-type semiconductor region 16, which is the outer periphery of silicon nitride layer 16a. The device is separated by element-separating regions comprised of p++-type semiconductor regions 13, 14, 15 and LOCOS element-separating insulation film 17. In this way, four approximately square PIN photodiodes PD1-PD4 are formed adjacent to each other. The outer periphery of the entire device has an approximately square shape. The side of each PIN photodiode PD1-PD4 has a length of, for example, approximately several microns to tens of μm. Each side of the approximately square device comprised of the four integrated photodiodes is, for example, about 40 μm. Also, the intervals between the PIN photodiodes are reduced to about 5 μm or less.

Conductive layer 27, made of Al/TiW or other metal, is formed via silicide layer 16b on n+-type semiconductor region 16 in a pattern, which is connected to n+-type semiconductor region 16 that forms the second semiconductor layer via silicide layer 16b along the outer periphery with respect to all four PIN photodiodes PD1-PD4, and which is divided into a separate segment for each of PIN photodiodes PD1-PD4. In other words, each of PIN photodiodes PD1-PD4 has an approximately square shape, and conductive layer 27 is formed in a segmented pattern connected to n+-type semiconductor region 16 via silicide layer 16b, with an L-shaped segment having inside sides overlapping respective ones of two outside sides of each square. It is also possible to directly connect conductive layer 27 to n+-type semiconductor region 16 via contact without forming silicide layer 16b.

The first insulation film 29, made of silicon oxide, etc., is formed on the entire surface to cover conductive layer 27, followed by forming the second insulation layer 31 on the first insulation layer 29. An opening H that reaches silicon nitride layer 16a on n+-type semiconductor region 16 that forms the second semiconductor layer is formed in the first insulation layer 29 and the second insulation layer 31 in the region inside the pattern of conductive layer 27. A ring-shaped (second) mask layer 30 made of TiN/Al/TiN, for example, is formed along the outer periphery of opening H. Also, a surface protective layer 22 is formed to cover the opening H.

For the four PIN photodiodes PD1-PD4 with the described configuration, since conductive layer 23 is connected to n+-type semiconductor region 16 via silicide layer 16b, a voltage can be applied to n+-type semiconductor region 16 via conductive layer 23.

Steps in a method of manufacturing the semiconductor device of FIGS. 20A and 20B are illustrated in FIGS. 21A-25B.

Figure 21A:
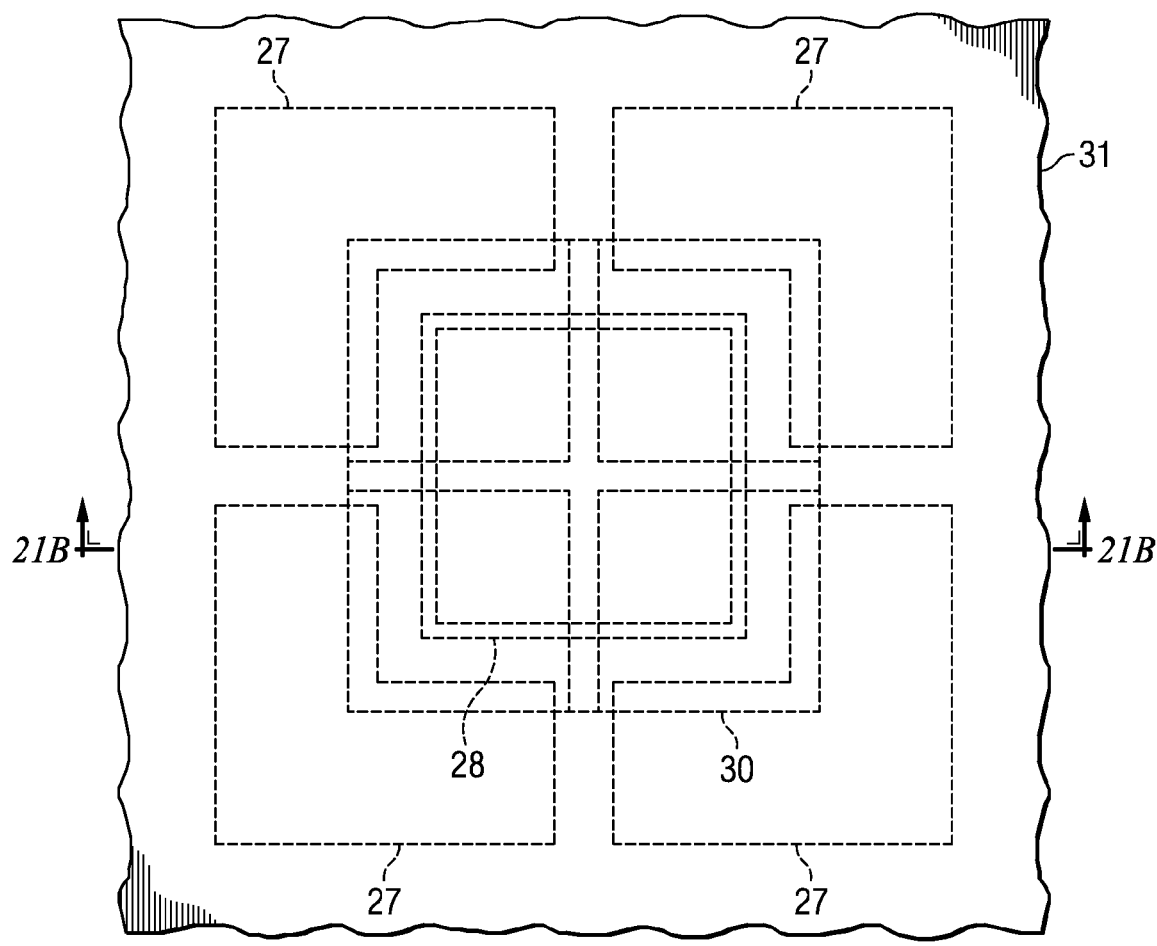
FIGS. 21A, 22A, 23A, 24A and 25A are plan views
Figure 21B:
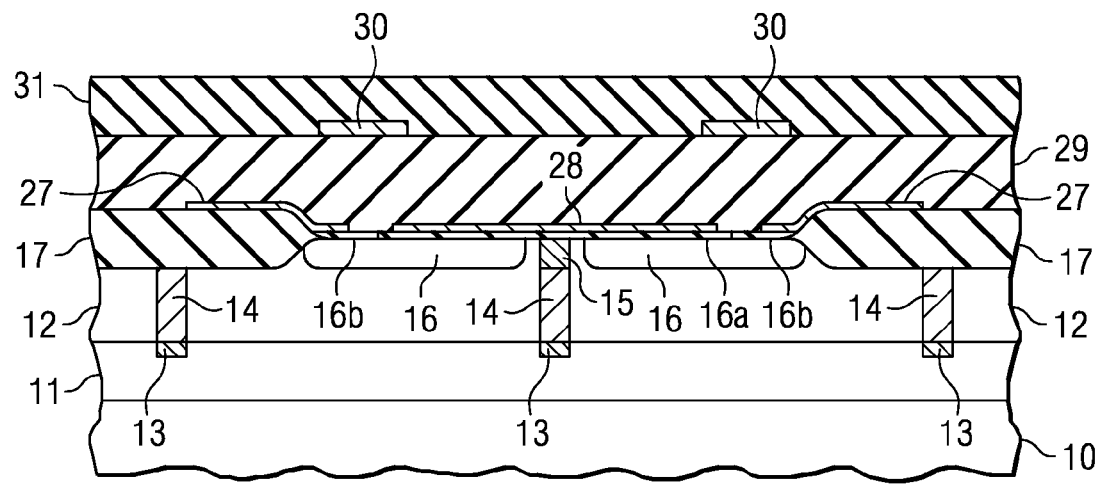
FIGS. 21B, 22B, 23B, 24B and 25B are section views, respectively taken along section lines identified by their figure numbers in the corresponding plan views, illustrating various steps in a process for the manufacture of the semiconductor device of FIGS. 20A and 20B.

As shown in FIGS. 21A and 21B, four approximately square-shaped PIN photodiodes PD1-PD4 are formed adjacent to each other in the same way as described in connection with the first embodiment. Then, a metal layer, made of Al/TiW, etc., is deposited by means of sputtering in a thickness of about 200-300 nm on the entire surface to cover silicon nitride layer 16a and silicide layer 16b on n+-type semiconductor region 16, followed by patterning to form conductive layer 27, which is divided for each of PIN photodiodes PD1-PD4 and is connected to n+-type semiconductor region 16 that forms the second semiconductor layer via silicide layer 16b along the outer periphery with respect to all of the four PIN photodiodes PD1-PD4. It is also possible to form conductive layer 27 directly on n+-type semiconductor region 16 without forming silicide layer 16b. At the same time as patterning conductive layer 27, a first mask layer 28 is formed in the region inside conductive layer 27 on n+-type semiconductor region 16 that forms the second semiconductor layer via silicon nitride layer 16a by patterning the same metal layer made of Al/TiW, etc., used for conductive layer 27.

The first insulation film 29 is then formed on the entire surface to cover conductive layer 27 and the first mask layer 28. The first insulation film 29 is formed as a single layer or as a plurality of laminated layers by depositing silicon oxide by CVD with TEOS used as the raw material, or by depositing a BPSG film, or by depositing silicon nitride by CVD. Then, TiN/Al/TiN, etc., is deposited in a thickness of about 200-300 nm on the first insulation film 19 by means of sputtering, followed by patterning for the second mask layer 30 having a region superposed with the outer periphery of the first mask layer 28. Then, like the first insulation film 29, the second insulation film 31 is formed on the entire surface to cover the second mask layer 30.

Figure 22A:
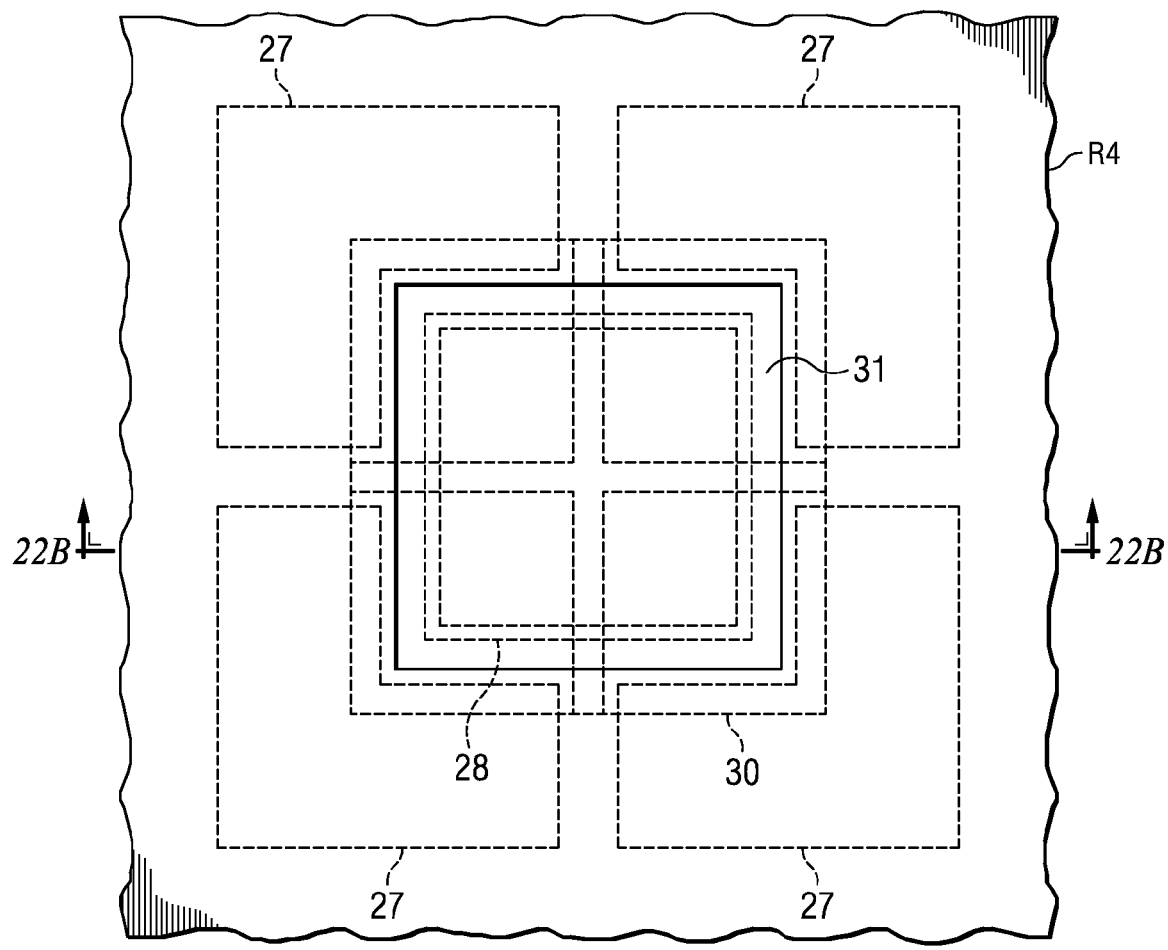
Figure 22B:
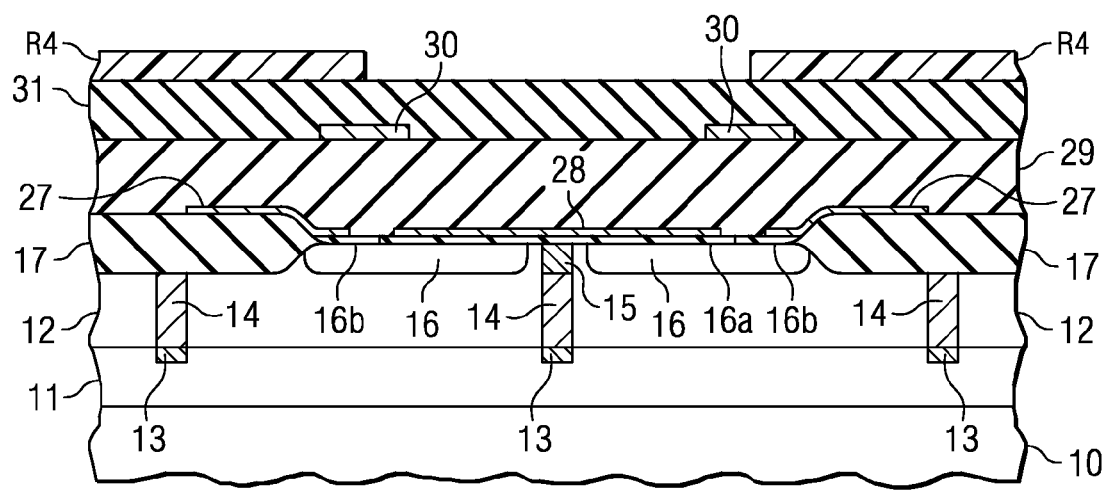
Figure 23A:
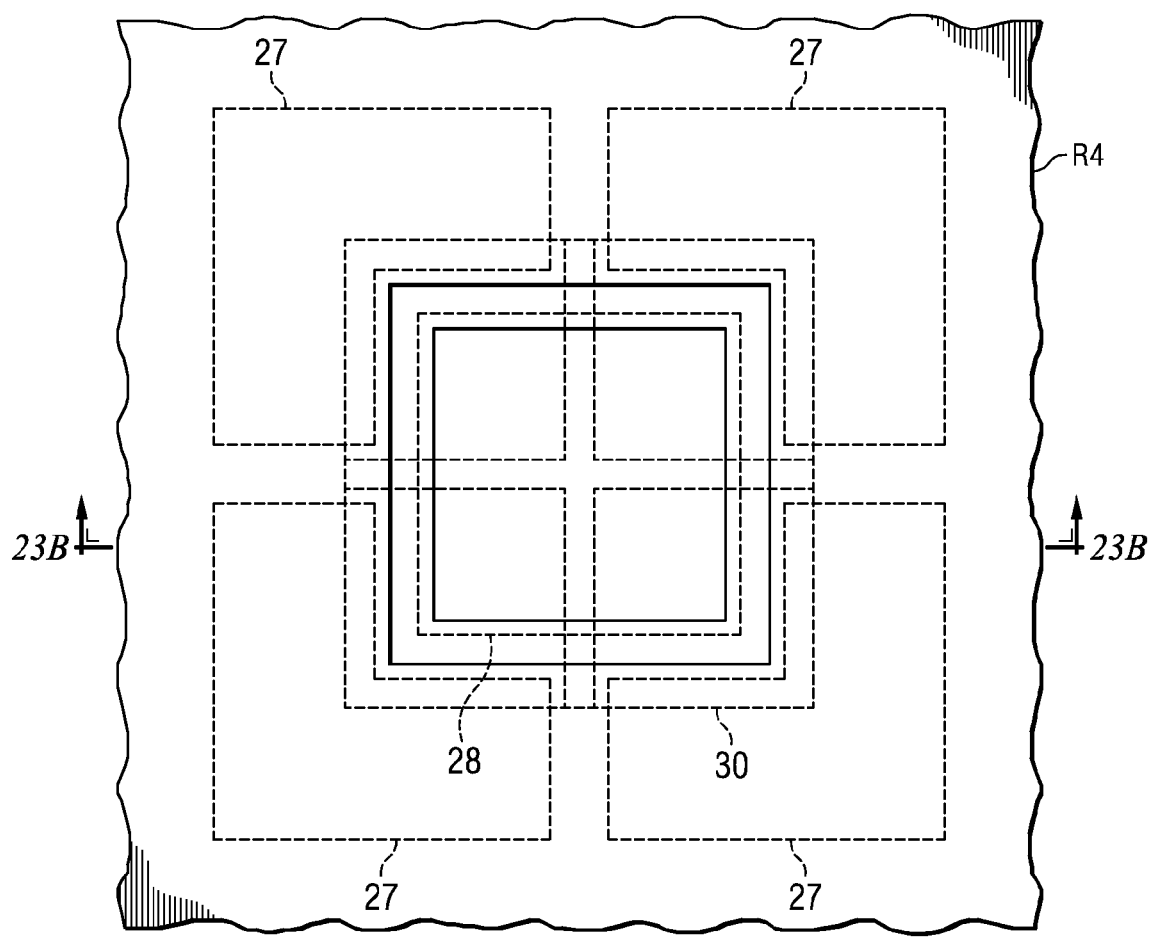
Figure 23B:
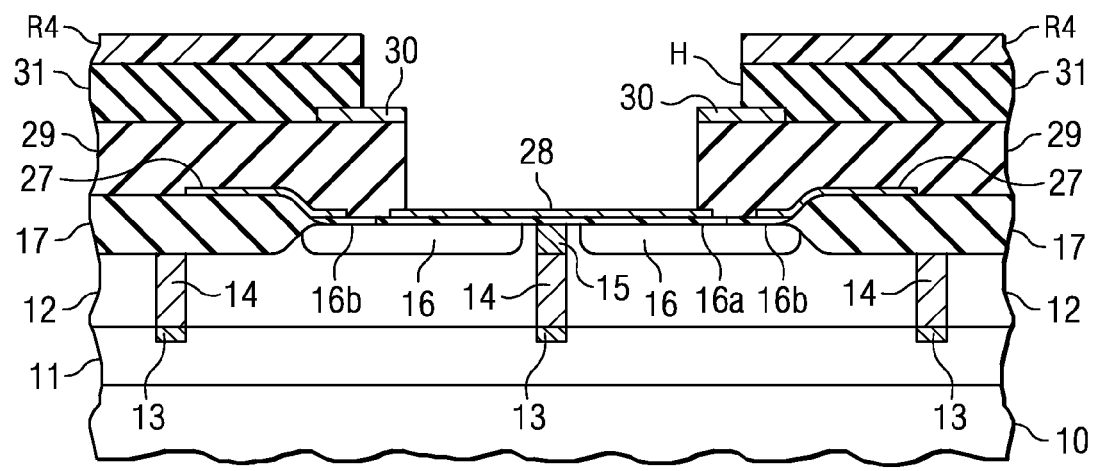

Next, as shown in FIGS. 22A and 22B, a resist film R4 is formed in such a pattern that the first mask layer 28 and/or the second mask layer 30 is present at any position in the open region. Then, as shown in FIGS. 23A and 23B, for example, with the first mask layer 28 and the second mask layer 30 used as etch stop layer, dry etching (such as reactive ion etching) is performed as the first etching to form opening H, which exposes the first mask layer 28 and the second mask layer 30, in the first insulation layer 29 and the second insulation layer 31. In this case, when the second mask layer 30 is absent, if the first and second insulation layers are thick, it may be difficult to keep the opening formed with resist film R4 used as mask within the range of the first mask layer 28. In this embodiment, however, there is a region superposed with the second mask layer 30 on the outer periphery of the first mask layer 28. Since the second mask layer is closer to resist film R4 than the first mask layer, it is possible to control the opening from going beyond the first and second mask layers.

Figure 24A:
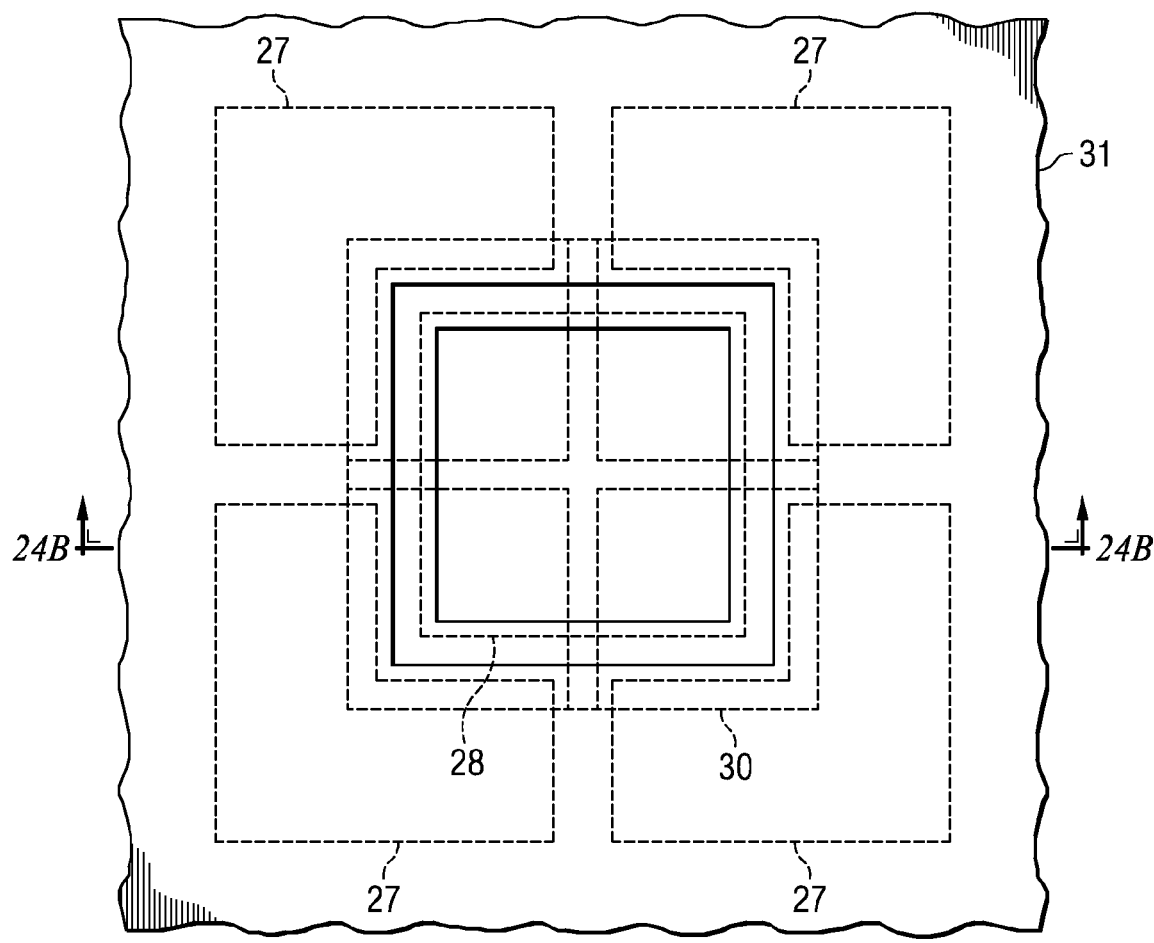
Figure 24B:
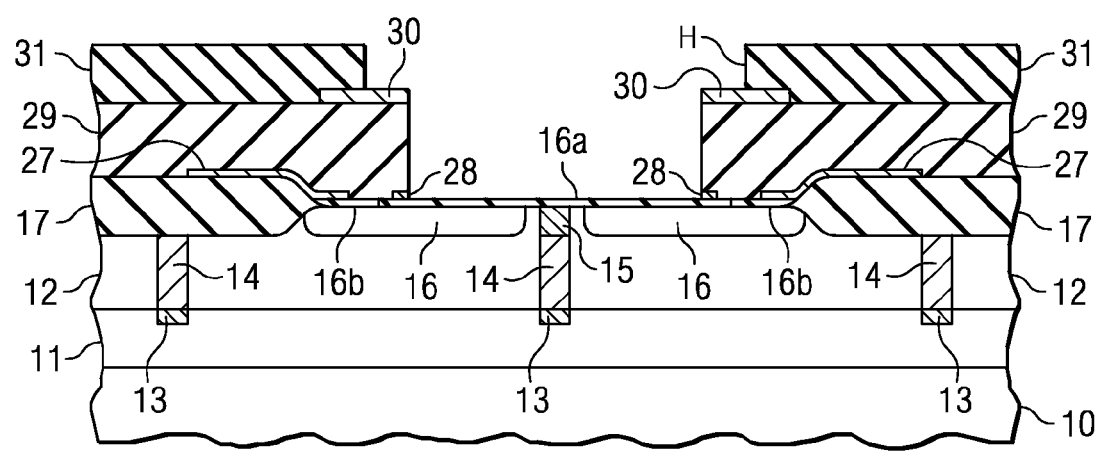

Next, as shown in FIGS. 24A and 24B, for example, after resist film R4 is removed, wet etching is performed as the second etching with the first insulation film 29 and the second insulation film 30 used as the etching mask to remove the first mask layer 28. In this case, an etching solution is used that leaves the second mask layer 30. As a result of the etching, the first mask layer 28 remains in a pattern on the silicon nitride layer 16a on n+-type semiconductor region 16 of the four PIN photodiodes PD1-PD4 in the region superposed with the second mask layer 30.

Figure 25A:
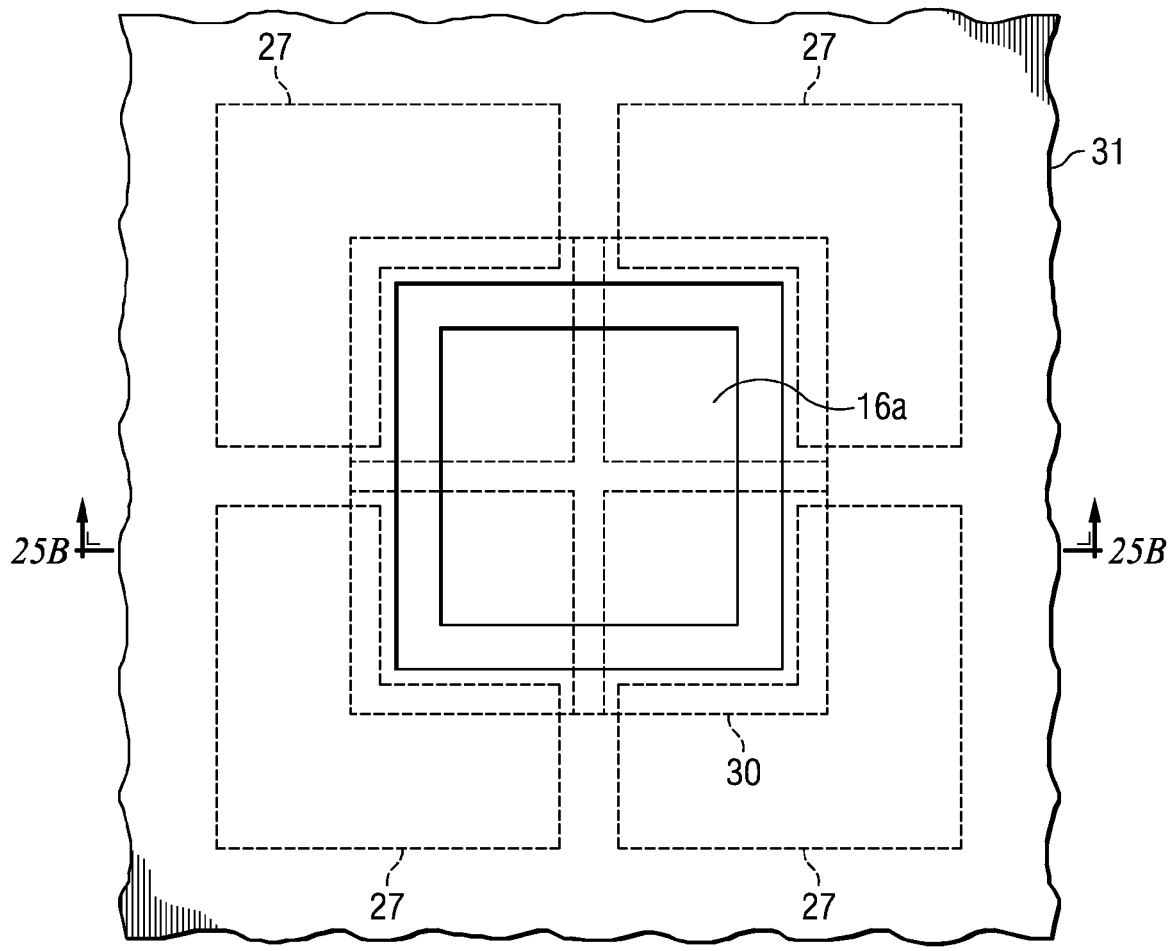
Figure 25B:
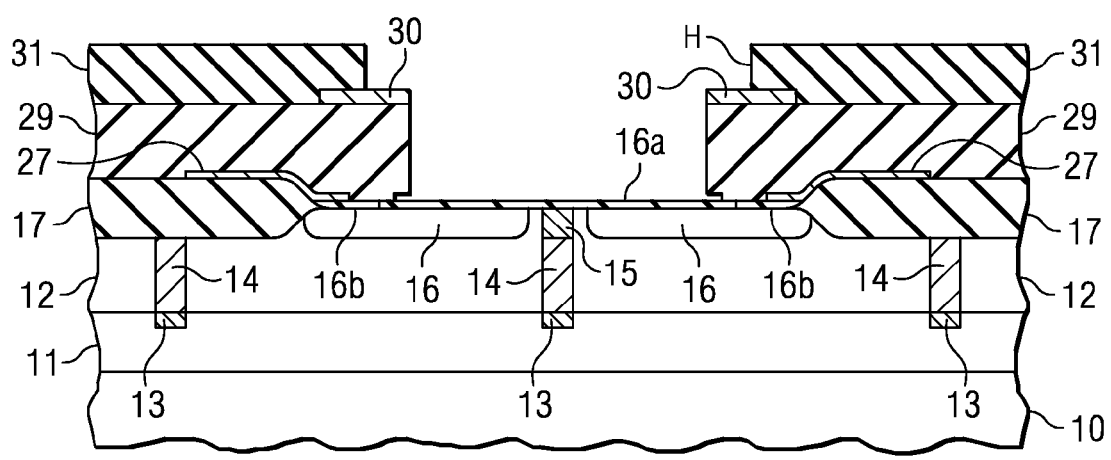
Figure 26A:
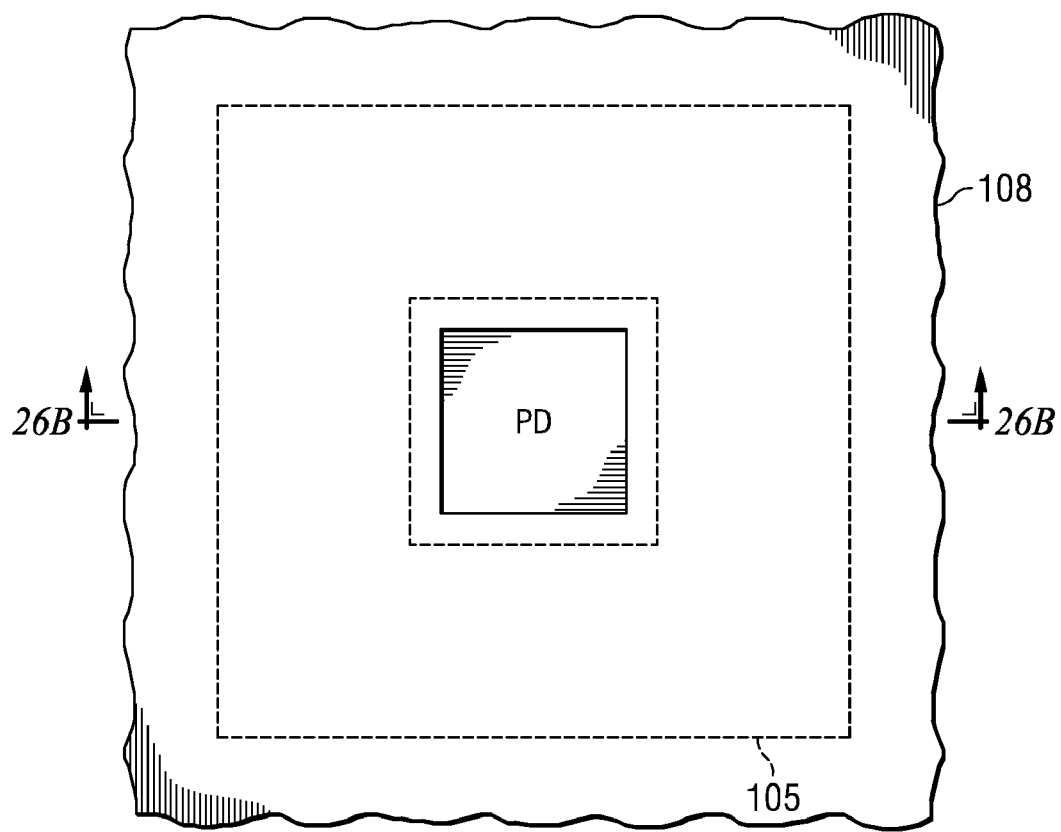
FIG. 26A is a plan view and FIG. 26B is a section view, taken along the section line 26B-26B of FIG. 26A, of a first example of a conventional semiconductor device.
Figure 26B:
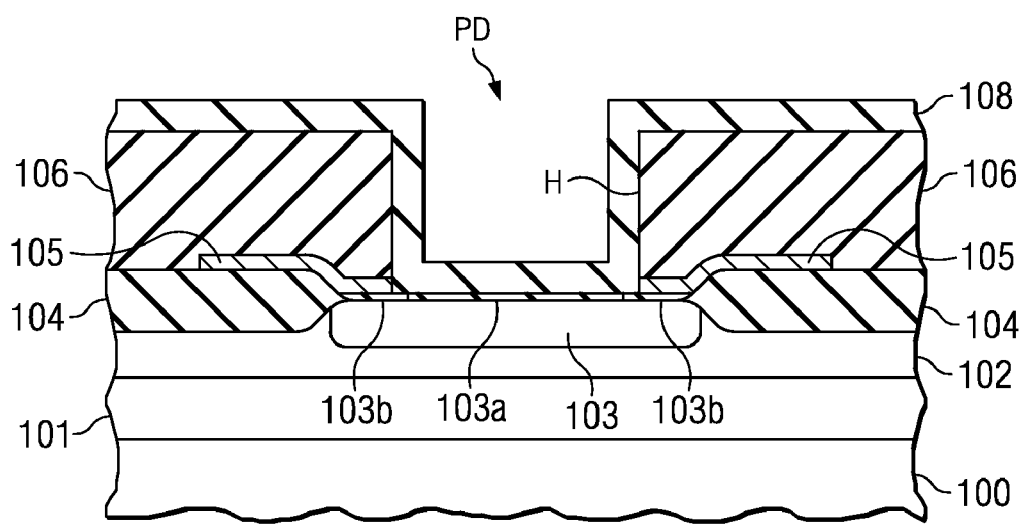
Figure 27A:
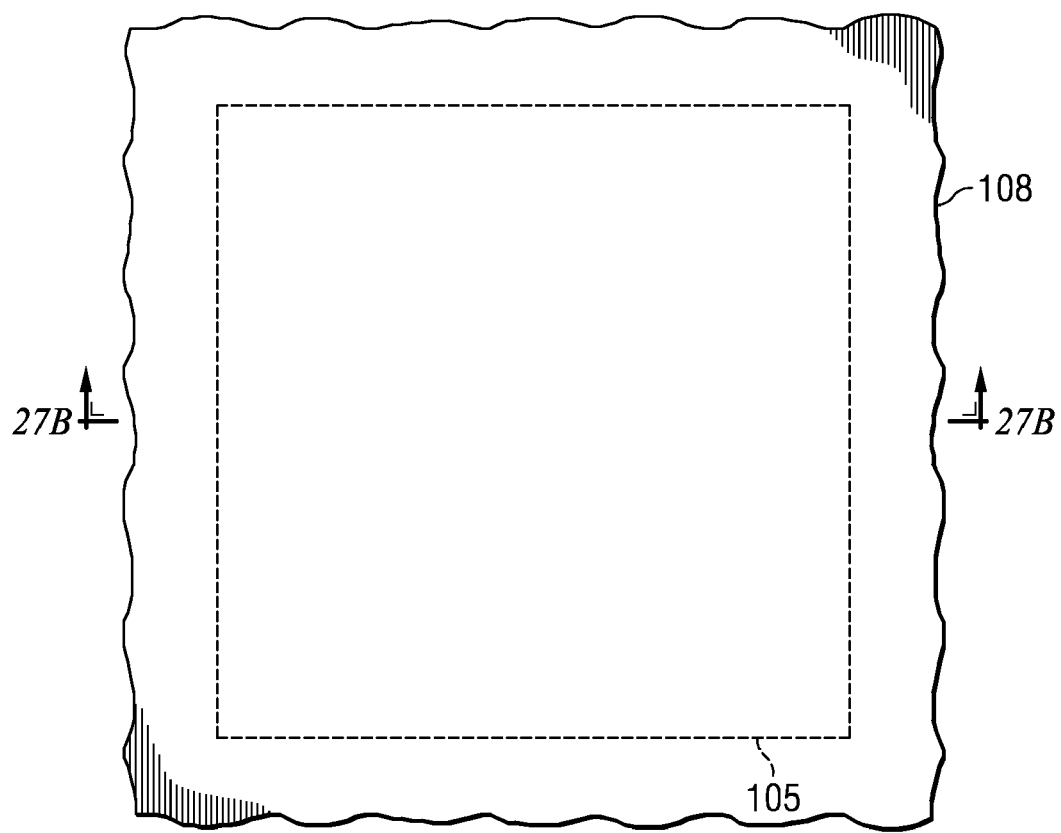
FIGS. 27A, 28A and 29A are plan views
Figure 27B:
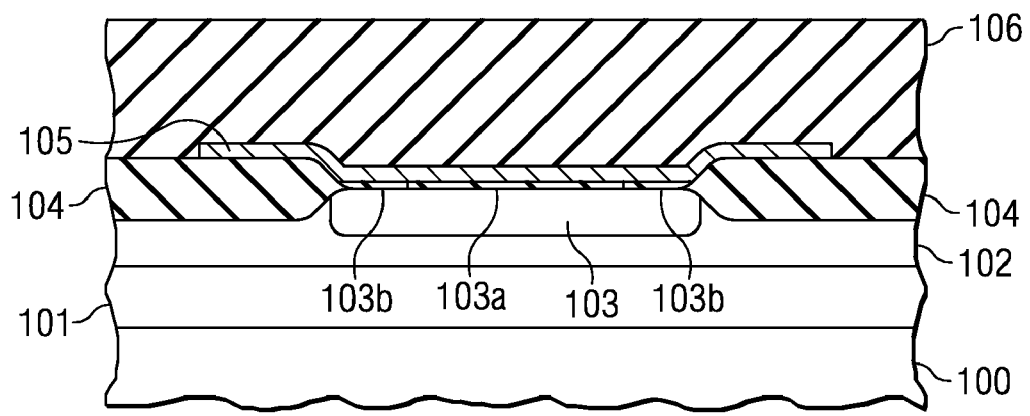
FIGS. 27B, 28B and 29B are section views, respectively taken along section lines identified by their figure numbers in the corresponding plan views, illustrating various steps in a process for the manufacture of the conventional semiconductor device of FIGS. 26A and 26B.
Figure 28A:
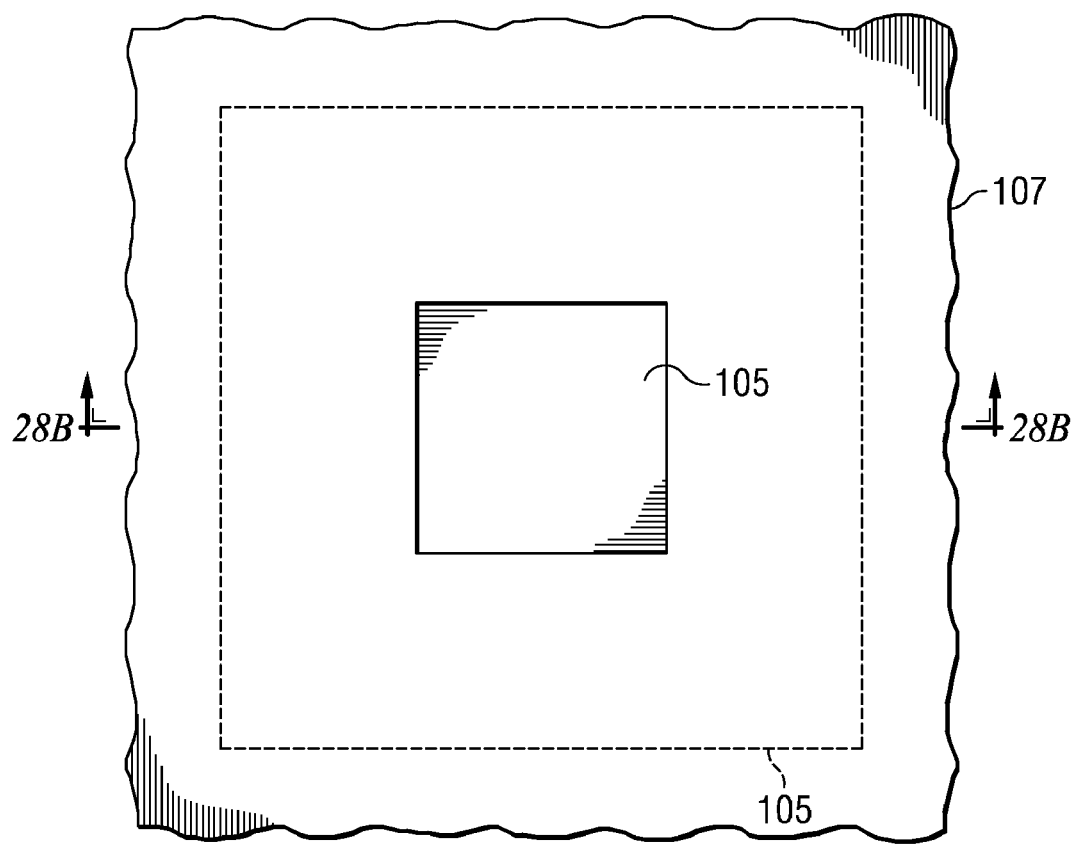
Figure 28B:
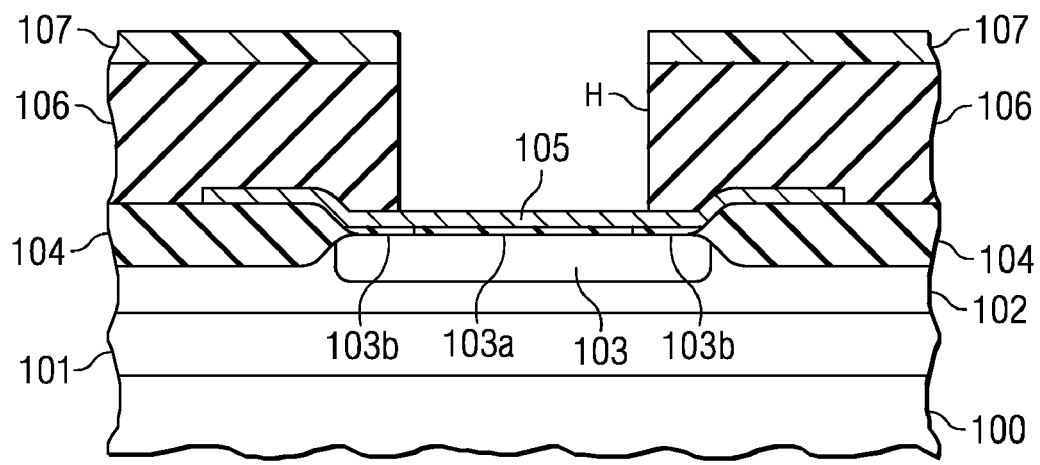
Figure 29A:
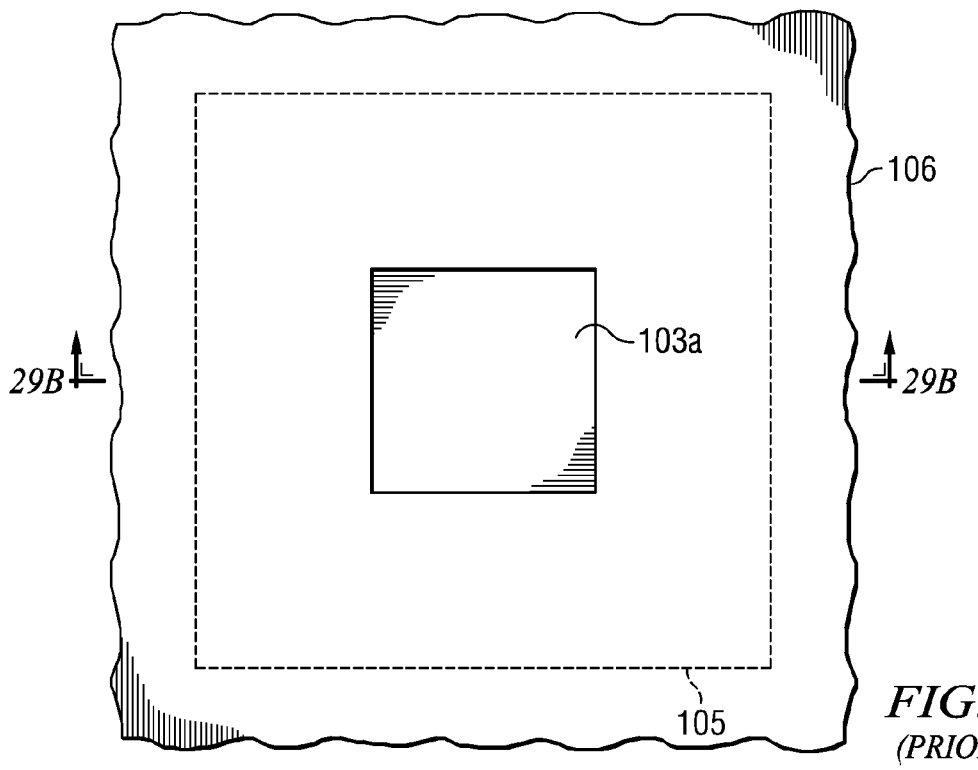
Figure 29B:
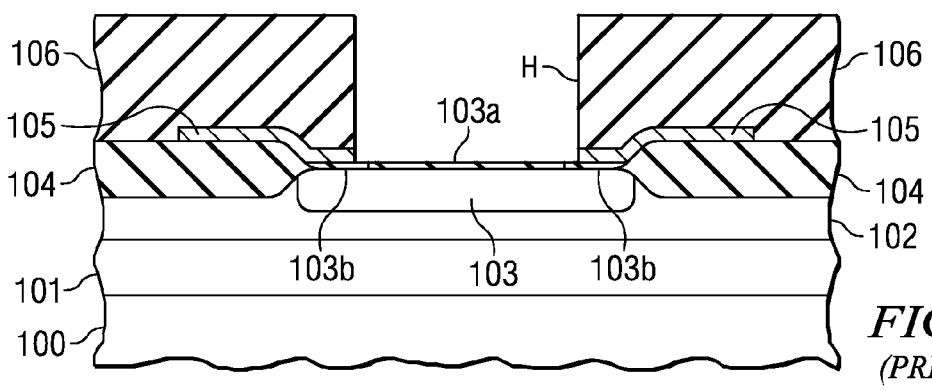
Figure 30:
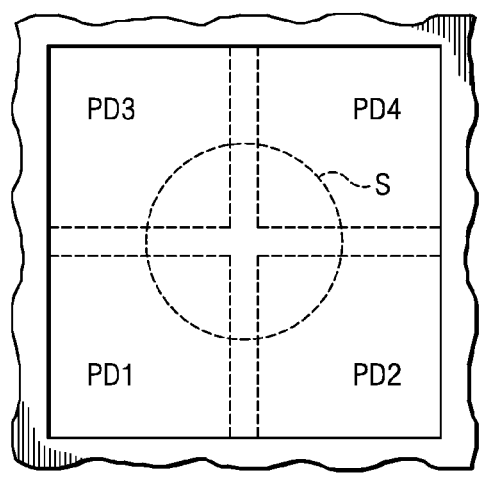
FIGS. 30, 31 and 32 are plan views, respectively, of other examples of conventional semiconductor devices.
Figure 31:
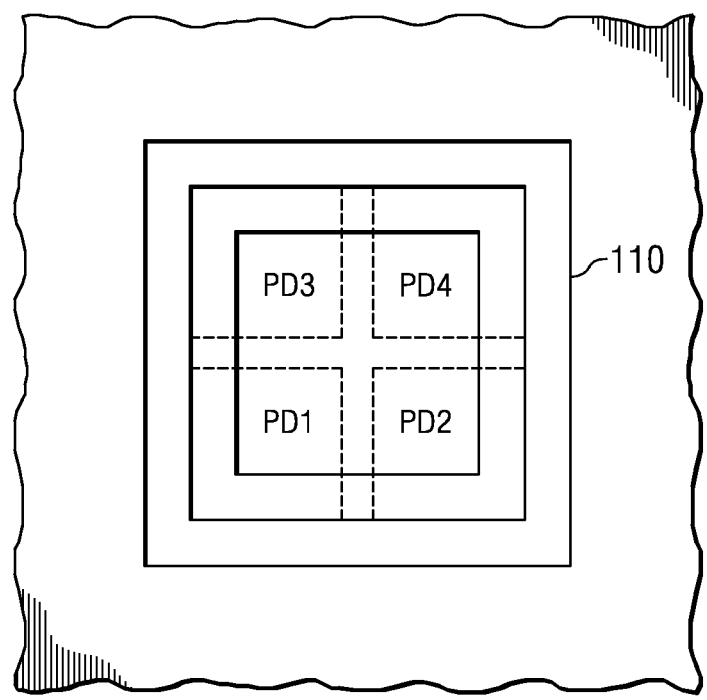
Figure 32:
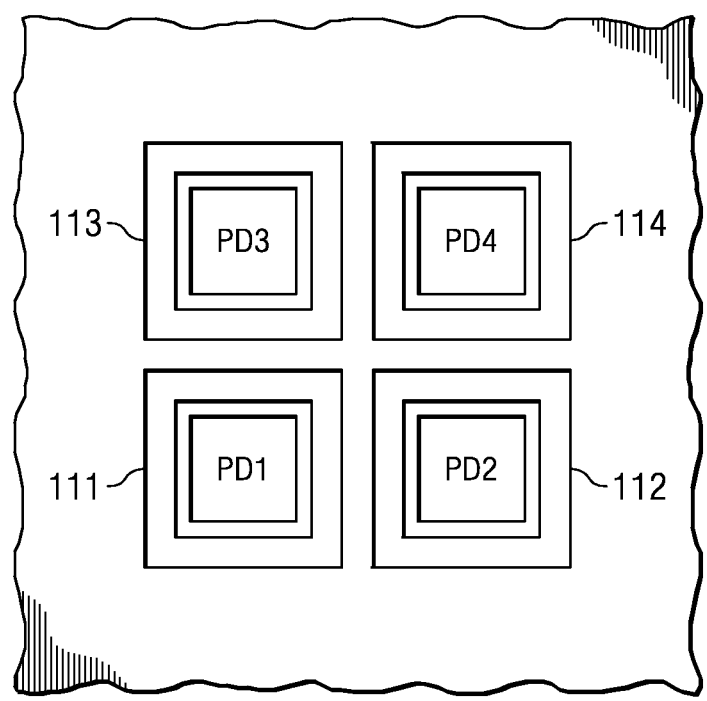

As shown in the FIGS. 25A and 25B, overetching is performed during the second etching to also carry out etching in the horizontal direction to remove the first mask layer 28. Because of the presence of silicon nitride layer 16a, there is no need to worry about short circuits even if the first mask layer 28 partially remains, as long as it is on the silicon nitride layer. After that, an insulation film made of silicon nitride is deposited by CVD to form surface protective layer 26 resulting in the semiconductor device shown in FIGS. 20A and 20B.

For the semiconductor device disclosed in the fourth embodiment, even if the opening is formed in the insulation film in order to improve the sensitivity as described in this manufacturing method, since the conductive layer and the mask layer are used as etching stopper, leakage-causing damage can be prevented. And, since the conductive layer connected to the second semiconductor layer that constitutes each photodiode is formed in a pattern divided for each photodiode, the photodiodes can be constituted so as to not short circuit.

In the described embodiment, the four PIN photodiodes are separated from each other by the p++-type semiconductor region. However, it is also possible to use a LOCOS element-separating insulation film in the same way as described in the second embodiment.

The described semiconductor devices can be used for light-receiving elements of optical pick-up devices incorporated in CD, DVD, or other optical disc devices. The described semiconductor device manufacturing methods can be used to manufacture semiconductor devices used for light-receiving elements of optical pick-up devices incorporated into CD, DVD, or other optical disc devices.

The claimed invention is not limited to the detailed embodiments given above. For example, in the embodiments, four photodiodes are formed adjacent to each other. It is also possible to form two, three, five or more photodiodes adjacent to each other. Also, in each of the embodiments, the first semiconductor layer is p-type, and the second semiconductor layer is n-type. It is also possible to reverse these conductivity types. In each of the embodiments, a silicide layer is formed in the n+ semiconductor region that forms the second semiconductor layer along the outer periphery with respect to all four photodiodes, and a conductive layer is formed corresponding to that silicide layer. The shape of the silicide layer and the conductive layer, however, is not limited to this. For example, it is possible to form the silicide layer and the conductive layer to surround the n+-type semiconductor region in each of the photodiodes. It is also possible to form the silicide layer and the conductive layer in part of the outer peripheral area of the n+-type semiconductor region. It is also possible to form the conductive layer on part of the silicide layer formed on the n+-type conductive layer. Those skilled in the art will appreciate that other variations are possible within the scope of the claimed invention.

What is claimed is:

1. A semiconductor device, comprising:
a p++-type silicon substrate;
a p--type first epitaxial layer formed on the p++-type silicon semiconductor substrate;
an n-type second epitaxial layer formed on the p--type epitaxial layer; the substrate and first and second epitaxial layers defining a pn junction of a PIN structural arrangement photodiode device;
a plurality of p++-type semiconductor regions extending from a top of the second epitaxial layer to a surface layer part of the first epitaxial layer and serving to divide the photodiode device into the four square-shaped quadrant PIN photodiode regions;
an n+-type semiconductor region formed in a surface layer part of the second epitaxial layer in each of the PIN photodiode regions;
a silicon nitride layer formed on the surface of the second epitaxial layer in a central part of the four PIN photodiode regions, including over the n+-type semiconductor regions;
a silicide layer formed on the surface of the second epitaxial layer along an outside edge of each n+-type semiconductor region at an outer periphery of the silicon nitride layer;
isolation regions formed to surround and isolate the four PIN photodiode regions from other regions of the second epitaxial layer;
a conductive layer electrically connected to the n+-type semiconductor regions via the silicide layer at the outer periphery of the four PIN photodiode regions, and being divided into L shaped segments respectively marginally bordering separate ones of the PIN photodiode regions, with two adjacent inside sides of each L-shaped segment overlapping corresponding two adjacent outside sides respectively of each square-shaped photodiode region;
a first insulation layer formed over the conductive layer;
a mask layer formed on the first insulation layer in a pattern of rectangular segments having inside corner portions superposed with respective outside corner portions of adjacent ones of the L-shaped segments of the PIN photodiode regions, and having other portions between and outward of, and not superposed with, the adjacent ones of the L-shaped segments;
a second insulation layer formed over the mask layer; there being an opening formed in the first and second insulation layers that reaches down to the silicon nitride layer and to the silicide layer over the n+-type semiconductor regions in a central region within the segment patterns of the conductive layer and the mask layer; and
a surface protective layer formed in the opening.

2. A semiconductor device, comprising:
a first semiconductor layer of a first conductivity type;
a second semiconductor layer of a second conductivity type formed over the first semiconductor layer, the first and second semiconductor layers defining a pn junction of a photodiode device;
element-separating regions formed at least in the second semiconductor layer and serving to divide the photodiode device into four photodiode region quadrants;
a first conductive layer patterned into separated segments respectively marginally over and bordering outside edges of separate ones of the photodiode region quadrants;
a first insulating layer formed over the conductive layer, with an opening in the first insulating layer over at least central portions adjoining the intersecting corners of the four photodiode region quadrants and a second conductive layer formed on outside edges of the four photodiode region quadrants, wherein the first conductive layer segments being formed over the second conductive layer and the second conductive layer comprises a metal silicide.

3. The device of claim 2, wherein the element separating regions comprise regions of the first conductivity type.

4. The device of claim 3, wherein the element separating regions further comprise regions of insulation material.

5. The device of claim 4, wherein the regions of insulation material comprise LOCOS insulation film regions.

6. The device of claim 2, further comprising a second conductive layer formed on outside edges of the four photodiode region quadrants, the first conductive layer segments being formed over the second conductive layer.

7. The device of claim 6, wherein the second conductive layer comprises a metal silicide.

8. The device of claim 2, further comprising a mask layer formed over the first insulating layer and defining at least portions of a circumference of the opening.

9. The device of claim 8, wherein the mask layer comprises a pattern of separated segments respectively having overlapping and non-overlapping portions with adjacent pairs of the separated first conductive layer segments.

10. The device of claim 9, wherein the first conductive layer segments are L-shaped segments; and the mask layer segments are rectangular segments.

11. The device of claim 10, wherein the overlapping portions of the rectangular segments are inside corner portions that overlap respective outside corner portions of adjacent ones of the L-shaped segments, and the non-overlapping portions include portions between the adjacent ones of the L-shaped segments.

12. The device of claim 9, wherein the opening has parts undercutting the first insulating layer underneath the mask layer segments.

13. The device of claim 2, wherein the opening has parts undercutting the first insulating layer.

14. The device of claim 13, further comprising a surface protective layer formed in the opening, including in the parts undercutting the first insulating layer.

15. The device of claim 2, further comprising regions of heavier doping of the second conductivity type formed in the photodiode region quadrants in the second semiconductor layer.

16. The device of claim 2, wherein the first conductive layer segments are L-shaped segments.

17. A semiconductor device, comprising:
a first semiconductor layer of a first conductivity type;
a second semiconductor layer of a second conductivity type formed over the first semiconductor layer, the first and second semiconductor layers defining a pn junction of a photodiode device;
element-separating regions formed at least in the second semiconductor layer and serving to divide the photodiode device into four photodiode region quadrants;
regions of heavier doping of the second conductivity type formed in the photodiode region quadrants in the second semiconductor layer;
a first conductive layer formed on outside edges of the four photodiode region quadrants;
a second conductive layer formed over the first conductive layer, the second conductive layer patterned into separated segments respectively marginally over and bordering outside edges of separate ones of the photodiode region quadrants;
a first insulating layer formed over the first conductive layer, with an opening in the first insulating layer over at least central portions adjoining the intersecting corners of the four photodiode region quadrants;
a mask layer formed over the first insulating layer and defining at least portions of a circumference of the opening; and
a second insulating layer formed over the mask layer, with an opening in the second insulating layer at least over the central portions.

18. The device of claim 17, wherein the second conductive layer segments are L-shaped segments; and wherein the mask layer comprises a pattern of separated segments respectively having portions spanning spaces between adjacent ones of the L-shaped segments.

19. The device of claim 18, wherein the mask layer segments are rectangular segments having inside corner portions that overlap respective outside corner portions of adjacent ones of the L-shaped segments.

20. The device of claim 19, wherein the opening in the first insulating layer has circumferential parts undercutting the first insulating layer underneath the mask layer segments.

* * * * *